(12) United States Patent
Arimoto et al.

(10) Patent No.: US 6,456,560 B2
(45) Date of Patent: Sep. 24, 2002

(54) SEMICONDUCTOR INTEGRATED CIRCUIT DEVICE WITH TEST INTERFACE CIRCUIT FOR PERFORMING TEST ON EMBEDDED MEMORY FROM OUTSIDE

(75) Inventors: Kazutami Arimoto, Hyogo (JP); Hiroki Shimano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/782,286

(22) Filed: Feb. 14, 2001

(30) Foreign Application Priority Data

Feb. 29, 2000 (JP) ........................................ 2000-053836

(51) Int. Cl.[7] ................................................ G11C 8/00
(52) U.S. Cl. ........................................ 365/233; 365/194
(58) Field of Search ................................ 365/233, 194

(56) References Cited

U.S. PATENT DOCUMENTS 5,778,237 A * 7/1998 Yamamoto et al. .... 395/750.04
6,247,138 B1 * 6/2001 Tamura et al. ............... 713/600
6,333,895 B1 * 12/2001 Hamamoto et al. ......... 365/233

FOREIGN PATENT DOCUMENTS

| JP | 0038996 | * | 3/1984 | ........... G11C/11/34 |
| JP | 59038996 A | * | 3/1984 | ........... G11C/11/34 |
| JP | 64-38671 | | 8/1989 | |

OTHER PUBLICATIONS

Betty Prince, "Semiconductor Memories", 1983, Wiley, 2nd pp. 474 and 475.*

* cited by examiner

*Primary Examiner*—M. Tran
(74) *Attorney, Agent, or Firm*—McDermott, Will & Emery

(57) ABSTRACT

A first test clock signal and a second test clock signal are generated from a common basic test clock signal using a delay line with a changeable delay time and a delay stage with a fixed delay time. A memory circuit is operated in synchronization with one of the first and second test clock signals, and the memory circuit is provided with a signal/data according to the other test clock signal. Thus, the set-up time and the hold time of a signal for the memory can be measured with accuracy in a memory-merged system LSI.

13 Claims, 15 Drawing Sheets

FIG. 2
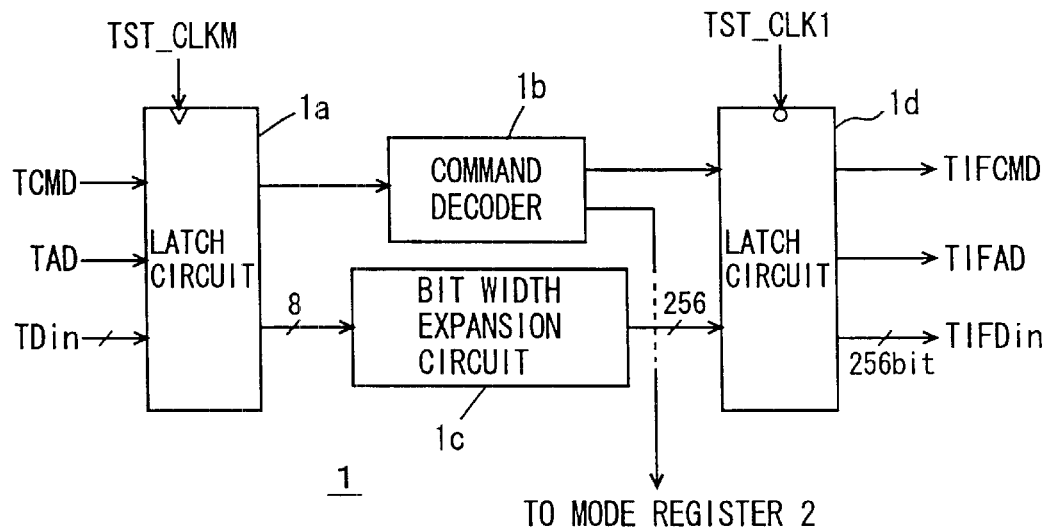
FIG. 3A TST_CLK1
FIG. 3B LATCH CIRCUIT 1d OUTPUT
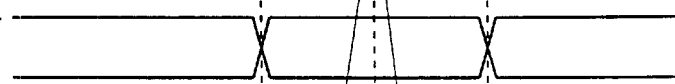
FIG. 3C TST_CLK2
FIG. 3D TST_CLK2
FIG. 3E TST_CLK2
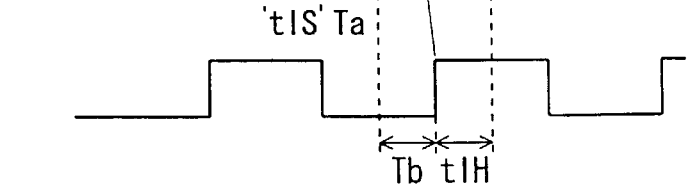

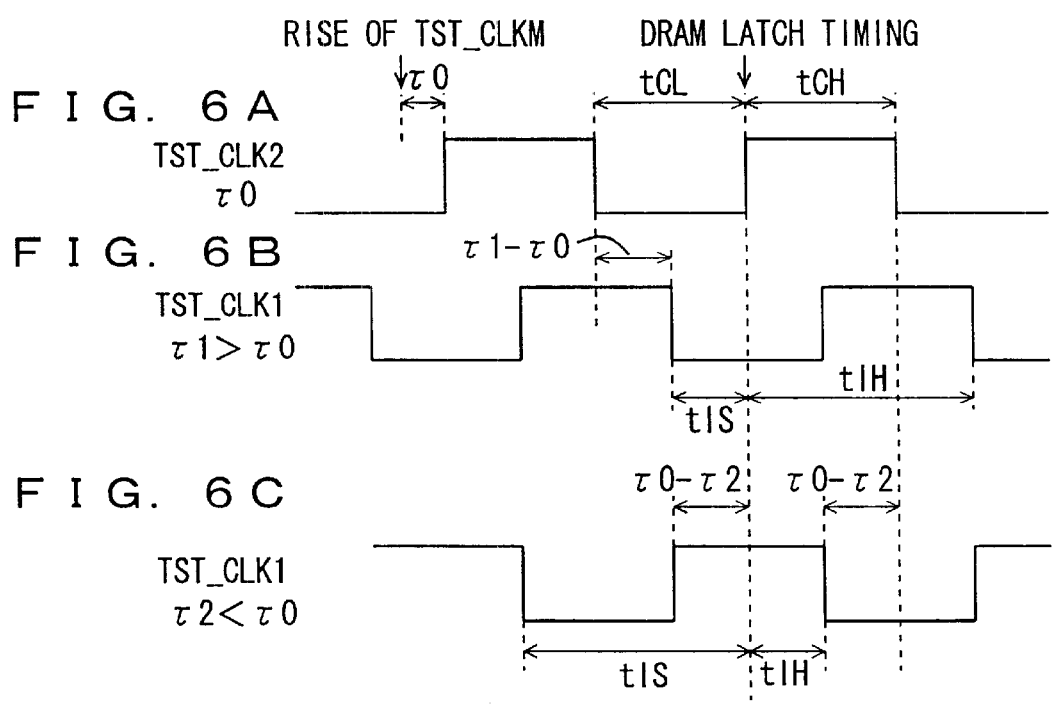

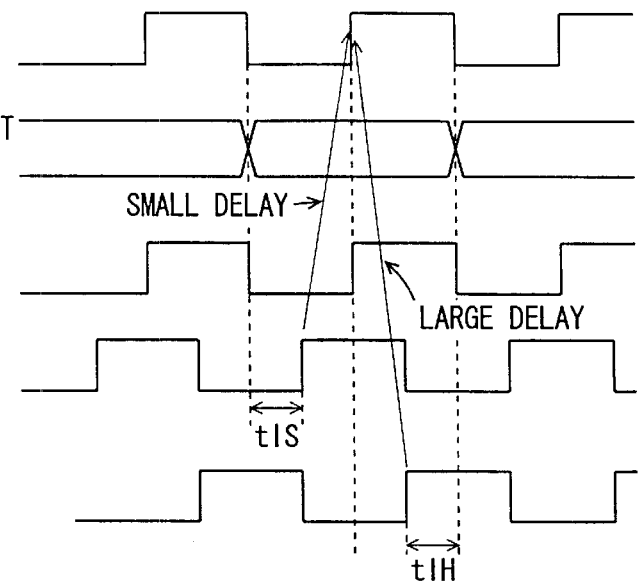
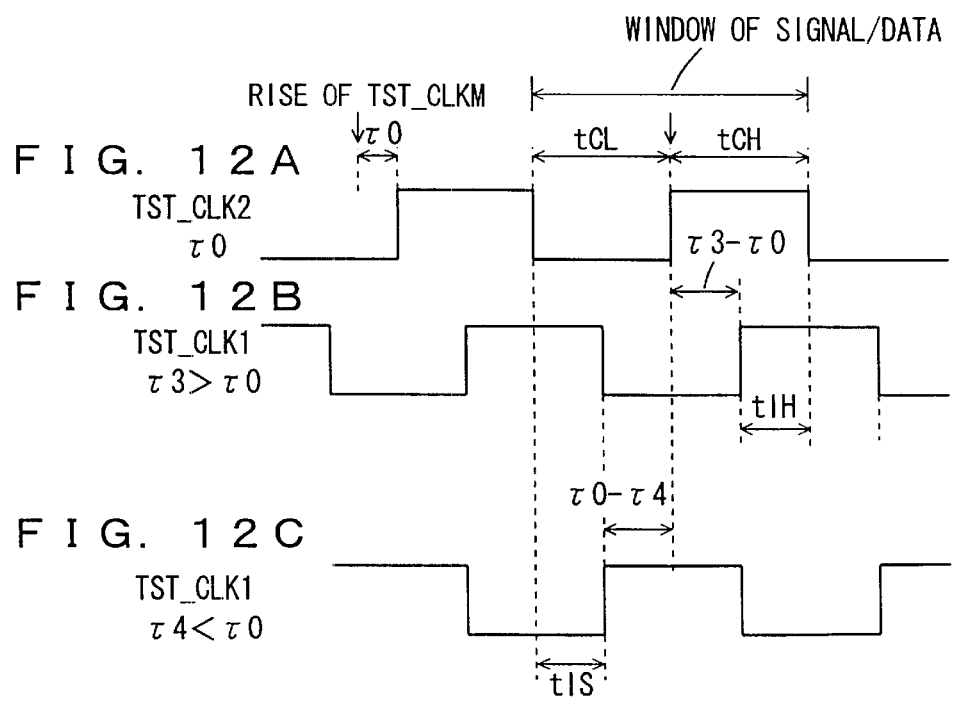

FIG. 13
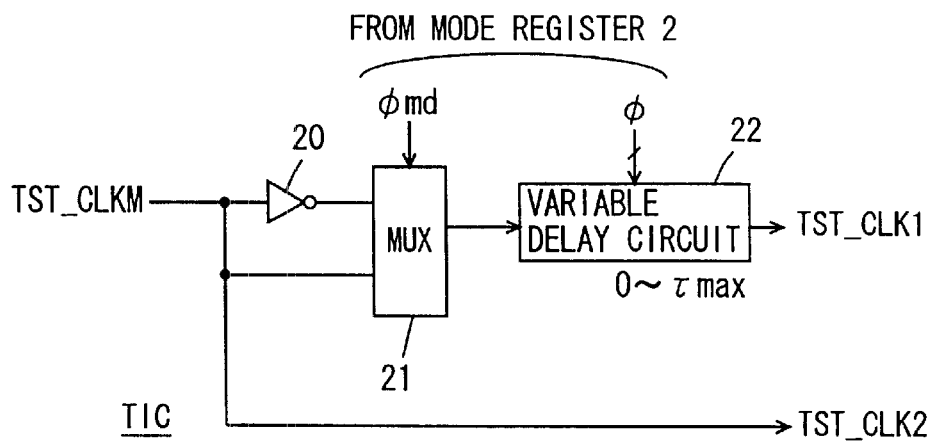
FIG. 14A TST_CLKM
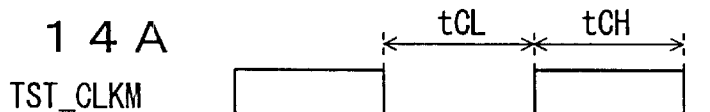
FIG. 14B OUTPUT FROM INVERTER 20
FIG. 14C TST_CLK1
FIG. 14D TST_CLK1
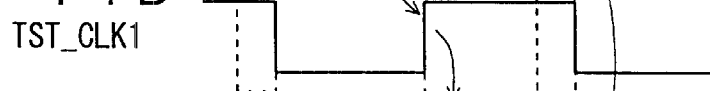
FIG. 14E TST_CLK2
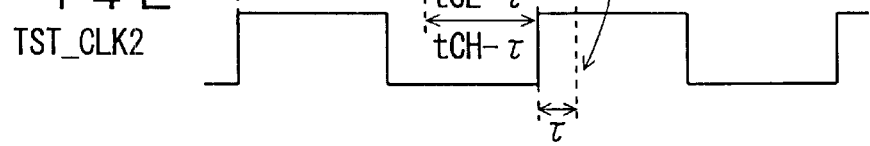

FIG. 24 PRIOR ART
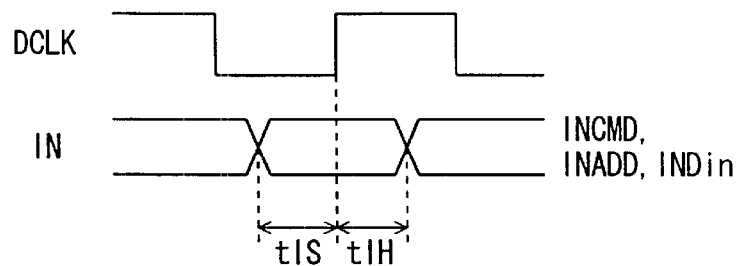
FIG. 25A PRIOR ART TCLK1
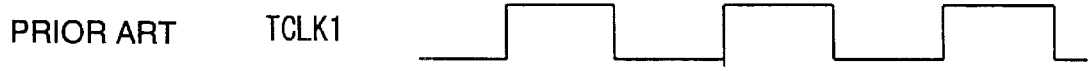
FIG. 25B PRIOR ART IN (INCMD, INADD, INDin)
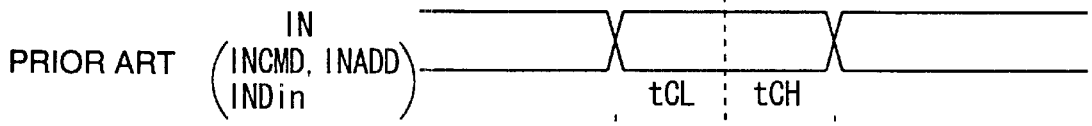
FIG. 25C PRIOR ART TCLK2
FIG. 25D PRIOR ART TCLK2
FIG. 25E PRIOR ART TCLK2
FIG. 26 PRIOR ART
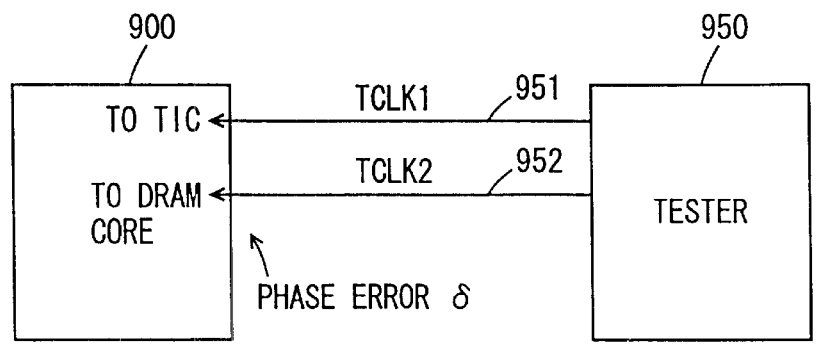

SEMICONDUCTOR INTEGRATED CIRCUIT DEVICE WITH TEST INTERFACE CIRCUIT FOR PERFORMING TEST ON EMBEDDED MEMORY FROM OUTSIDE

BACKGROUND OF THE INVENTION

1. Field of the Invention

The present invention relates to a semiconductor integrated circuit device, and particularly, to a system LSI (Large Scale Integrated circuit) with a logic and a memory being merged therein. More specifically, the present invention relates to an arrangement of a test interface circuit for testing a memory within the system LSI directly from an outside.

2. Description of the Background Art

In a system LSI such as a logic-merged DRAM in which a logic such as a processor or an ASIC (Application-Specific Integrated Circuit) and a dynamic random access memory (DRAM) of a large storage capacity are integrated on the same semiconductor chip (semiconductor substrate), the logic and the memory such as a DRAM are interconnected by a multi-bit internal data bus of 128 bits to 512 bits so that a data transfer speed that is ten times to hundred times faster than a general-purpose DRAM can be achieved. In addition, the DRAM and the logic are connected by internal interconnection lines which are sufficiently short and which have a small parasitic impedance in comparison with the wiring provided on the board, so that the charging/discharging current of the data bus can be significantly reduced and the signal transfer can be performed at a high speed. Moreover, since the logic and the DRAM are connected by internal interconnection lines, the number of external pin terminals for the logic can be reduced when compared with the case in which a general-purpose DRAM is provided externally to the logic. For these reasons, a DRAM-embedded system LSI substantially contributes to improving the performance of the information equipment for performing processes handling a large amount of data, such as three-dimensional graphic processing, image and audio processing, and the like.

In a system LSI such as the above logic-merged DRAM, the logic alone is coupled to terminals via pads. Consequently, when the functions of a memory such as an embedded DRAM are to be tested, the test must be performed through the logic. In this case, however, the logic will have to perform the control for the test, which imposes a greater load on the logic. Moreover, an instruction for performing a functional test of the memory such as a DRAM must be provided from outside to the logic, which in turn provides a control signal for performing the functional test to the memory such as the DRAM, and the test result must be externally read out through the logic. Thus, the functional test for the memory such as a DRAM would be carried out through the logic so that the test on the operation timing margin and the like of the DRAM cannot be performed with accuracy. In addition, from the viewpoint of program capacity, it is difficult to fully ensure the reliability of the memory such as a DRAM since the number of test patterns generated by the logic would be limited and sufficient testing cannot be performed. Furthermore, the increase in gate scale results in a higher rate of defects in the logic itself, which leads to a lower reliability of the memory test. As a result, there is a need to test the memory such as a DRAM directly from outside via a test apparatus.

FIG. 17 is a schematic representation of the arrangement of a conventional DRAM-embedded system LSI. In FIG. 17, a system LSI 900 includes a large-scale logic LG coupled to an external pin terminal group LPGA for performing an instructed processing, an analog core ACR coupled between large-scale logic LG and an external pin terminal group APG for performing a processing related to an analog signal, a DRAM core MCR coupled to large-scale logic LG via internal interconnection lines for storing data required by large-scale logic LG, and a test interface circuit TIC for disconnecting large-scale logic LG from DRAM core MCR and for coupling an external memory tester to DRAM core MCR via a test pin terminal group TPG in a test mode. DRAM core MCR receives a power-supply voltage VCC via a power-supply pin terminal PST.

Analog core ACR includes a phase-locked loop circuit (PLL) for generating an internal clock signal, an analog/digital converter for converting an external analog signal into a digital signal, and a digital/analog converter for converting a digital signal received from large-scale logic LG into an analog signal and outputting the converted signal.

DRAM core MCR is a clock synchronous memory (SDRAM: Synchronous Dynamic Random Access Memory) which takes in data and an operating mode designation signal and outputs data in synchronization with a clock signal.

Large-scale logic LG includes a memory control unit for performing processing, e.g., of image/audio information processing and for controlling access to DRAM core MCR.

As shown in FIG. 17, the provision of test interface circuit TIC allows the complete isolation of DRAM core MCR from the logic portion (large-scale logic LG) and the direct access to DRAM core MCR through external test pin terminal group TPG, enabling direct external control and external monitoring of DRAM core MCR. Such a testing technique is referred to as the direct memory access test. By providing this test interface circuit TIC, the conventional memory tester can be utilized, and the tests of substantially the same contents as those for the general-purpose DRAM (SDRAM) can be performed.

FIG. 18 is a diagram representing the arrangement of test interface circuit TIC shown in FIG. 17 and a portion related to test interface circuit TIC. In FIG. 18, test pin terminal group TPG includes a pin terminal for receiving a test clock signal TCLK1, a pin terminal for receiving a test control signal TCMD for designating a test operating mode, a pin terminal for receiving a test address TAD for designating a memory cell to be accessed in DRAM core MCR in a test mode, a pin terminal for receiving write data TDin in the test mode, and a pin terminal for receiving output data TDout from test interface circuit TIC in the test mode. Test write data TDin applied to test interface circuit TIC and test data TDout output from test interface circuit TIC are made to have a bit width of, for instance, 8 bits as in the case of the general-purpose DRAM.

Test interface circuit TIC includes a latch/command decoder 1 for performing such operations as taking in test control signal TCMD, test address TAD, and test write data TDin applied to test pin terminal group TPG in synchronization with test clock signal TCLK1, decoding the test control signal into an internal command (operating mode designation signal) to be issued to DRAM core MCR, and expanding test input data TDin of 8 bit width to write data of 256 bits; a mode register 2 for storing information such as column latency of DRAM core MCR; a CA shifter 3 for shifting a read select designation signal received from latch/command decoder 1 according to the column latency information stored in mode register 2 to generate a read data selecting signal RD_S; and a 256 to 8 selection circuit 4 for selecting data of 8 bits from test read data TFIDout of 256 bits read from DRAM core MCR according to read data selecting signal RD_S from CA shifter 3.

As test peripheral circuits, there are provided a selector 5 for selectively coupling DRAM core MCR to one of the large-scale logic and test interface circuit TIC in response to a test mode designation signal TE, a gate circuit 6 for receiving a clock signal applied from, for example, the large-scale logic in a normal operating mode and a test clock signal TCLK2 applied in a test mode to apply a clock signal DCLK to DRAM core MCR, and a gate circuit 7 for transmitting read data RD of 256 bits read from DRAM core MCR to test interface circuit TIC in activation of test mode designation signal TE. Read data RD of 256 bits read from DRAM core MCR is also applied to the large-scale logic not through selector 5 in order to apply the read data to the large-scale logic at a high speed in the normal operating mode.

DRAM core MCR takes in applied data and signal in synchronization with a DRAM clock signal DCLK and also outputs read data RD.

Now, the operation of the test interface circuit shown in FIG. 18 will be described with reference to the timing chart shown in FIG. 19.

As shown in FIG. 18, DRAM core MCR transfers write data INDin and read data RD via different buses. Similarly, test input data TDin and test output data TDout are transferred via different pin terminals of test pin terminal group TPG in a test.

In a clock cycle #1, a test control signal for designating a data read is applied from a tester (a read command (read operation designation signal) READ is applied to DRAM core MCR). Test control signal TCMD applied in clock cycle #1 is applied as read command READ in a clock cycle #2 to DRAM core MCR via selector 5 from test interface circuit TIC. In the test mode, selector 5, in accordance with test mode designation signal TE, disconnects the large-scale logic from DRAM core MCR, and selects and transfers to DRAM core MCR a test interface command (test operating mode designation signal) TIFCMD, a test interface address TIFAD, and test interface input data TIFDin outputted from test interface circuit TIC. Gate circuit 7 transmits to test interface circuit TIC data RD read from DRAM core MCR in accordance with test mode designation signal TE.

In addition, test clock signals TCLK1 and TCLK2 are clock signals of the same frequency and the same phase.

DRAM core MCR reads internal data in synchronization with clock signal DCLK applied from gate circuit 6, according to concurrently applied internal address INADD. When column latency CL of DRAM core MCR is two clock cycles, the valid read data is outputted at the rising edge of test clock signal TCLK2 of cycle #4 according to internal read command READ (INCMD) applied in cycle #2.

In test interface circuit TIC, CA shifter 3 shifts the selecting signal generated from the upper five bits of a column address included in a test address TAD for the cycle period of column latency CL (which also includes the delay time in test interface circuit TIC when the selecting signal is generated from test address TAD) according to test clock signal TCLK1. Thus, when read data RD of 256 bits from DRAM core MCR arrives at selection circuit 4 via gate circuit 7, a selecting signal RD_S from CA shifter 3 also attains the definite state. Selection circuit 4 selects 8 bits of data from the 256 bits of data according to selecting signal RD_S, and transmits the selected data as test read data TDout (D00) to a pin terminal group.

In clock cycle #2, test control signal TCMD instructing a data write is applied to DRAM core MCR from outside. Latch/command decoder 1 decodes test control signal TCMD into a write command (operating mode designation signal) WRITE instructing a data write. When the write command is applied, write data TDin (DA) is also applied at the same time to a test pin terminal group. Write command WRITE and test input data DA are also transferred in synchronization with the test clock signal in test interface circuit TIC. A bit width expansion circuit is provided for input data TDin in latch/command decoder 1, and 8-bit test input data DA (TDin) is converted into 256-bit internal write data DAin (data lines of 8 bits are expanded into data lines of 256 bits).

A test control signal to be decoded into read command READ for designating a data read is applied as test control signal TCMD from outside in clock cycle #3, and thereafter, a test control signal to be decoded into write command WRITE for designating a data write is applied in the next clock cycle #4. In this case, internal write data DBin is applied to DRAM core MCR in clock cycle #5. Then, data Dout of 256 bits is read from DRAM core MCR in clock cycle #6, and thereafter, selection circuit 4 of test interface circuit TIC outputs read data DO1 of 8 bits as test data TDout in clock cycle #6.

Data indicating the number of clock cycles of the signal propagation delay in test interface circuit TIC (one clock cycle in the example shown in FIG. 19) and of column latency CL are stored in mode register 2. CA shifter 3 performs the shift operation according to test clock signal TCLK1 by the period set in mode register 2 so as to select the data read out from DRAM core MCR at an accurate timing and to read the test data.

The provision of the above-described test interface circuit TIC allows an external tester directly to access DRAM core MCR, to perform required tests on DRAM core MCR using a tester for a general-purpose SDRAM.

FIG. 20 is a diagram more specifically representing the arrangement of latch/command decoder 1 shown in FIG. 18. In FIG. 20, latch/command decoder 1 includes a latch circuit 1a for taking in and latching a test control signal TCMD, a test address TAD, and test write data TDin in response to the rise of a test clock signal TCLK1; a command decoder 1b for receiving and decoding test control signal TCMD and a prescribed bit of test address TAD from latch circuit 1a to generate a command for designating an operating mode; a bit width expansion circuit 1c for expanding 8-bit test write data TDin from latch circuit 1a into 256-bit test write data; and a latch circuit 1d for taking in and latching output signals from command decoder 1b and bit width expansion circuit 1c in response to the fall of test clock signal TCLK1. Latch circuit 1d outputs a test command TIFCMD, a test address TIFAD, and test write data TIFDin, which are applied via selector 5 to DRAM core MCR. The command from command decoder 1b is also applied to mode register 2 and causes mode register 2 to store an address bit or test data when a mode register set mode is designated. Command decoder 1b receives test control signal TCMD and a prescribed address bit, and generates an internal command for designating an operating mode such as a mode register set command MRS, a no operation command NOP, a bank active command ACT, a bank precharge command PRE, a write command WRITE, a read command READ, and an auto-refresh command REFA.

As shown in FIG. 20, latch circuit 1a enters the latching state (or the through state) in response to the rise of test clock signal TCLK1, and latch circuit 1d enters the latching state (or the through state) in response to the fall of test clock signal TCLK1.

FIG. 21 is a timing chart representing an operation of latch/command decoder 1 shown in FIG. 20. The operation of latch/command decoder 1 shown in FIG. 20 will be described briefly below with reference to FIG. 21.

Latch circuit 1a is, for instance, an up-edge trigger type latch circuit which latches an applied signal at the rising edge of test clock signal TCLK1 to change the state of an output signal (test control signal TCMD, test address TAD, and test write data TDin). The output signal from latch circuit 1a is maintained for one clock cycle of test clock signal TCLK1.

Latch circuit 1b is, for instance, a down-edge trigger type latch circuit which latches an applied signal in response to the fall of test clock signal TCLK1. Thus, an output signal from latch circuit 1b (TIFCMD, TIFAD, and TIFDin) changes in synchronization with the fall of test clock signal TCLK1. Before the rise of test clock signal TCLK1, latch circuit 1a receives an external signal such as a test control signal. Consequently, in test interface circuit TIC, an internal command and the like are applied via selector 5 to DRAM core MCR with the delay of one clock cycle period of test clock signal TCLK1 relative to the application of an external signal, as shown in FIG. 19. As shown in FIG. 20, latch circuits 1a and 1d can be utilized to transfer test control signal TCMD, test address TAD, and test write data TDin in synchronization with test clock signal TCLK1.

FIG. 22 is a diagram representing an example of the arrangement of a signal input buffer in DRAM core MCR. In FIG. 22, an input circuit of the input buffer includes a CMOS transmission gate G1 rendered conductive in response to a DRAM clock signal DCLK and a complementary DRAM clock signal ZDCLK to transmit an input signal IN; an inverter circuit G2 for inverting an input signal from CMOS transmission gate G1; an inverter circuit G3 for inverting an output signal from inverter circuit G2 to generate an internal signal OUT; and a CMOS transmission gate G4 made conductive complementarily to CMOS transmission gate G1 according to DRAM clock signals DCLK and ZDCLK for coupling an input of inverter circuit G2 with an output of inverter circuit G3. DRAM clock signal DCLK is generated from an OR circuit 6 shown in FIG. 18. In a test mode, DRAM dock signal DCLK is the same in frequency and phase as test clock signal TCLK2. Now, an operation of the input circuit shown in FIG. 22 will be described with reference to the timing chart shown in FIG. 23.

When DRAM clock signal DCLK (test clock signal TCLK2) is at the logic low or L level, CMOS transmission gate G1 is in the conductive state and CMOS transmission gate G4 is in the non-conductive state. Input signal IN passes through CMOS transmission gate G1, and an output signal OUT is generated by inverter circuits G2 and G3 according to input signal IN. Thus, when DRAM clock signal DCLK (test clock signal TCLK2) is at the L level, the input circuit enters the through state in which it allows the input signal IN to pass through.

When DRAM clock signal DCLK (test clock signal TCLK2) is at the logic high or H level, CMOS transmission gate G1 becomes non-conductive, while CMOS transmission gate G4 becomes conductive. In this state, input signal IN does not effect the output signal OUT. Inverter circuits G2 and G3 and CMOS transmission gate G4 latches output signal OUT. Thus, output signal OUT is retained in the state corresponding to the state of input signal IN at a time immediately before the rise of DRAM clock signal DCLK. In other words, the input circuit enters the latching state when DRAM clock signal DCLK is at the H level.

Thus, as shown in FIG. 20, a signal/data applied via selector 5 from test interface circuit TIC can be accurately taken in DRAM core MCR by transmitting an internal signal from latch circuit 1d of latch/command decoder 1 in synchronization with the fall of test clock signal TCLK1 and by latching the internal signal in the input circuit in DRAM core MCR in response to the rise of DRAM clock signal DCLK.

The test items of the AC (alternating current) timing for DRAM core MCR include a set-up time tIS and a hold time tIH for each of an input command, an address, and write data. Set-up time tIS and hold time tIH are time periods required for taking in data accurately in DRAM core MCR, as shown in FIG. 24.

FIG. 24 is a diagram illustrating set-up time tIS and hold time tIH when DRAM core MCR takes in signal IN (INCMD, INADD, INDin) at the rising edge of DRAM clock signal DCLK. As shown in FIG. 24, set-up time tIS is the minimum time required to retain input signal IN in the definite state in relation to the rising edge of DRAM clock signal DCLK. Hold time tIH is the minimum time for which input signal IN is required to be held in the definite state from the rising edge of DRAM clock signal DCLK. By holding input signal IN in the definite state during set-up time tIS and hold time tIH with respect to the timing at which input signal IN is taken in, input signal IN can be accurately taken in, and an internal signal corresponding to the input signal IN can be generated. Two test clock signals TCLK1 and TCLK2 are used to determine whether the specification values for set-up time tIS and hold time tIH are met.

Now, consider the case in which signal IN (INCMD, INADD, INDin) is applied to the DRAM core in synchronization with the fall of test clock signal TCLK1 as shown in FIGS. 25A and 25B. In this case, when test clock signal TCLK2 shown in FIG. 25C and test clock signal TCLK1 shown in FIG. 25A have the same phase, the set-up period for input signal IN is equal to the period tCL during which test clock signal TCLK1 (TCLK2) is at the L level, since the input circuit of the DRAM core MCR shown in FIG. 22 is in the through state while clock signal DCLK is at the L level. Input signal IN is transmitted in synchronization with the fall of test clock signal TCLK1 so that input signal IN changes in synchronization with the fall of test clock signal TCLK1. Therefore, the hold period of input signal IN is equal to the period tCH during which test clock signal TCLK1 (TCLK2) is at the H level.

Now, assume that the phase of test clock signal TCLK2 is advanced by time $\tau$ relative to test clock signal TCLK1 as shown in FIG. 25D. In this case, the DRAM core takes in, input signal IN in synchronization with the rise of test clock signal TCLK2 (the input circuit shown in FIG. 22 enters the latching state when test clock signal TCLK2 (DRAM clock signal DCLK) attains the H level). Consequently, the set-up period of input signal IN is a period tCL−$\tau$, which is shorter by time $\tau$ corresponding to the phase difference. Therefore, set-up time tIS can be derived from the phase of test clock signal TCLK2 at which an error occurs in the read data from the DRAM core as the phase of test clock signal TCLK2 is advanced.

On the other hand, as shown in FIG. 25E, when the phase of test clock signal TCLK2 is delayed by time $\tau$ relative to test clock signal TCLK1, hold period tIH for input signal IN becomes a period tCH–τ. Thus, in this case, hold time tIH can be derived from the phase difference at which an error firstly occurs in the read data from DRAM core MCR.

There is a need to utilize two individual test clock signals TCLK1 and TCLK2 in order to measure set-up time tIS and hold time tIH.

FIG. 26 is a schematic representation of the application of a test clock signal to a DRAM-embedded system LSI 900. In FIG. 26, test clock signals TCLK1 and TCLK2 are applied to DRAM-embedded system LSI 900 via signal lines 951 and 952 from a tester 950. Test clock signal TCLK1 transmitted via signal line 951 is applied to test interface circuit TIC within system LSI 900, and test clock signal TCLK2 is applied to gate circuit 6 provided for the DRAM core. Thus, test clock signals TCLK1 and TCLK2 are transmitted from tester 950 to test interface circuit TIC and the DRAM core through separate paths.

When the line lengths of the signal lines 951 and 952 differ and when the propagation line lengths of test clock signals TCLK1 and TCLK2 within system LSI 900 differ, a skew δ due to the propagation delay is generated between these test clock signals TCLK1 and TCLK2. Consequently, because of the inherent skew δ of these test clock signals TCLK1 and TCLK2, there is an error δ in set-up time tIS and hold time tIH derived according to the technique shown in FIG. 25. As a result, accurate set-up time tIS and hold time tIH cannot be measured.

In addition, as shown in FIG. 18, selection circuit 4 selects 8-bit data from data RD of 256 bits read out from DRAM core MCR. The selecting operation of selection circuit 4 is performed according to a read selecting signal RD_S from CA shifter 3. CA shifter 3 performs a shifting operation according to test clock signal TCLK1 applied to test interface circuit TIC. Consequently, as shown in FIG. 27, read data selecting signal RD_S is activated in synchronization with test clock signal TCLK1. On the other hand, DRAM core MCR operates in synchronization with test clock signal TCLK2 so that read data RD is output in synchronization with test clock signal TCLK2.

Thus, in selection circuit 4 of test interface circuit TIC, the timing at which read data selecting signal RD_S becomes definite and the timing at which internal read data INDout becomes definite change according to the phase variation of test clock signal TCLK2. Therefore, as the timing at which internal read data INDout becomes definite deviates to a large extent from the timing at which read data selecting signal RD_S becomes definite when the phase of test clock signal TCLK2 changes, there exists a period in which indefinite data is output as external read data TDout. If an external apparatus samples the data in this period according to test clock signal TCLK1, an error would be found to exist in the read data.

The phase relation between read data selecting signal RD_S and internal read data INDout in the test interface circuit also changes according to the phase relation between test clock signals TCLK1 and TCLK2 so that, when an error occurs in the read data, it cannot be determined whether the data selection is performed at an inappropriate timing in the selection circuit in test interface circuit TIC or the error occurs due to inadequate set-up period/hold period in the DRAM core. As a result, the set-up time/hold time cannot be measured with accuracy.

In the normal operating mode, a clock signal CLK is transmitted to DRAM core MCR, and three clock signal lines are provided in the system LSI. As a result, the dock signal interconnection within the system LSI becomes complicated. When a common test clock signal TCLK is supplied to test interface circuit TIC and the DRAM core in order to solve the problem of the skew of test clock signals TCLK1 and TCLK2, set-up time tIS and hold time tIH cannot be measured. Moreover, when clock signal CLK and test clock signal TCLK1 are employed, if their interconnection line lengths differ, a phase difference is caused, whereby the accurate measurement becomes impossible.

SUMMARY OF THE INVENTION

An object of the present invention is to provide a semiconductor integrated circuit device capable of measuring, with accuracy, the set-up time and the hold time for a memory in a system LSI with an embedded memory.

Another object of the present invention is to provide a test interface circuit capable of measuring the set-up time and the hold time of an input signal of a memory with accuracy without complicating a clock path.

A further object of the present invention is to provide a test interface circuit capable of measuring, with accuracy, the set-up time and the hold time of an input signal for a DRAM core in a DRAM-embedded system LSI.

In brief, the semiconductor integrated circuit device according to the present invention generates two internal test clock signals using a basic test dock signal, operates a memory according to one internal test clock signal, and operates a test interface circuit in synchronization with the other internal test clock signal.

A common basic test clock signal is utilized to generate first and second test clock signals, and a memory circuit is operated according to one of these first and second test clock signals, and a control signal to the memory circuit is transferred in synchronization with the other clock signal so that the inherent phase offset of the test clock signals caused by the interconnection lines of a tester and the like can be eliminated, and the test clock phases can be set accurately. Moreover, the set-up time and the hold time can be measured by adjusting the phases of first and second test clock signals in the clock circuit. A memory circuit and a read transfer circuit are operated in synchronization with the same clock signal so that the phase difference of first and second test clock signals is kept from adversely affecting the read data selecting operation in the test interface circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic representation of the arrangement of a latch/command decoder shown in FIG. 1.

FIGS. 3A to 3E are diagrams schematically showing the phase relation of test clock signals in the first embodiment of the present invention.

FIGS. 6A to 6C are diagrams illustrating the correspondence between the phase relation and the set-up/hold time of test clock signals in the first embodiment of the present invention.

FIGS. 11A to 11E are diagrams schematically representing the phase relation of test clock signals in the second embodiment of the present invention.

FIGS. 12A to 12C are diagrams schematically representing the correspondence between the phase difference and the set-up/hold time of test clock signals in the second embodiment of the present invention.

FIG. 13 is a schematic representation of the arrangement of a main portion of a test interface circuit according to a third embodiment of the present invention.

FIGS. 14A to 14E are signal waveform diagrams representing an operation of a circuit shown in FIG. 13.

FIG. 24 is a diagram representing a set-up time and a hold time.

FIGS. 25A to 25E are diagrams illustrating the relation between the set-up time and the hold time and the phase difference of test dock signals in a conventional test interface circuit.

FIG. 26 is a schematic representation of a test environment for a system LSI.

DESCRIPTION OF THE PREFERRED EMBODIMENTS

First Embodiment

Figure 1:
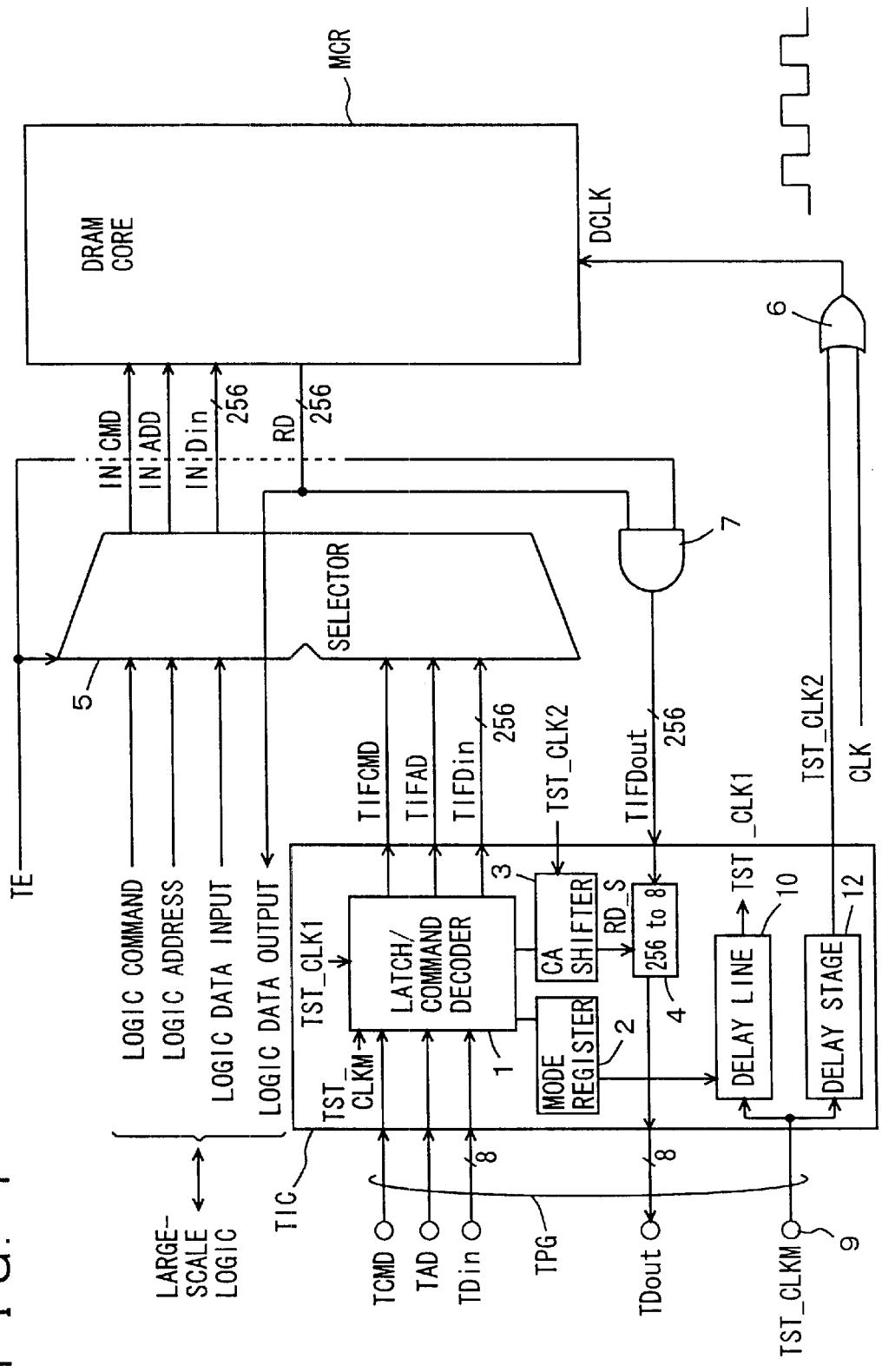
FIG. 1 is a schematic representation of the overall arrangement of a semiconductor integrated circuit device according to a first embodiment of the present invention.

FIG. 1 is a schematic representation of the arrangement of a main portion of a semiconductor integrated circuit device according to the first embodiment of the present invention. In FIG. 1, a test interface circuit TIC includes a delay line 10 and a delay stage 12 for receiving in common a basic test clock signal TST_CLKM applied to a test clock input terminal 9 included in a test pin terminal group TPG. Delay line 10 has its delay time set according to data stored in a mode register 2, delays basic test clock signal TST_CLKM by the set delay time, and generates a first test clock signal TST_CLK1 which is applied to a latch/command decoder 1.

Delay stage 12 has a fixed delay time, and delays basic test clock signal TST_CLKM by the fixed delay time, and generates a second test clock signal TST_CLK2 which is applied to a CA shifter 3 and an OR circuit 6. The delay time of delay stage 12 equals the default value (reset value) of the delay time of delay line 10.

A DRAM core MCR operates in synchronization with a DRAM clock signal DCLK from OR circuit 6. Thus, in a test mode, DRAM core MCR operates in synchronization with second test clock signal TST_CLK2.

In test interface circuit TIC, latch/command decoder 1 operates in synchronization with first test clock signal TSC_CLK1 from delay line 10. Consequently, an internal command INCMD, an internal address signal INADD, and internal write data INDin provided to DRAM core MCR change in synchronization with first test clock signal TST_CLK1. By changing the delay time for delay line 10, the phase difference between first clock signal TST_CLK1 and second clock signal TST_CLK2 can be changed. In other words, the set-up period and the hold period of an input signal for DRAM core MCR can be changed in order to measure the set-up time and the hold time.

In test interface circuit TIC, CA shifter 3 performs the shifting operation in synchronization with second test dock signal TST_CLK2. As a result, read data selecting signal RD_S from CA shifter 3 attains the definite state in synchronization with second test clock signal TST_CLK2. Consequently, the phase difference between the timing at which data RD read out from DRAM core MCR arrives at a selection circuit 4 and the timing at which read data selecting signal RD_S from CA shifter 3 becomes definite does not change even when the phase difference between test clock signal TST_CLK1 and test dock signal TST_CLK2 changes so that, in test interface circuit TIC, selection circuit 4 accurately selects and outputs the data read out from DRAM core MCR. Thus, the set-up time and the hold time of an input signal/data for DRAM core MCR can be measured with accuracy by changing the phase difference between test clock signals TST_CLK1 and TST_CLK2.

In addition, first test clock signal TST_CLK1 and second test clock signal TST_CLK2 are generated within the semiconductor integrated circuit device using the common basic test clock signal TST_CLKM. When a test clock signal is applied from a tester, no phase difference exists in basic test clock signal TST_CLKM applied to delay line 10 and to delay stage 12 so that a set-up time tIS and a hold time tIH of an input signal for DRAM core MCR can be accurately measured using two-phase test clock signals TST_CLK1 and TST_CLK2.

Figure 18:
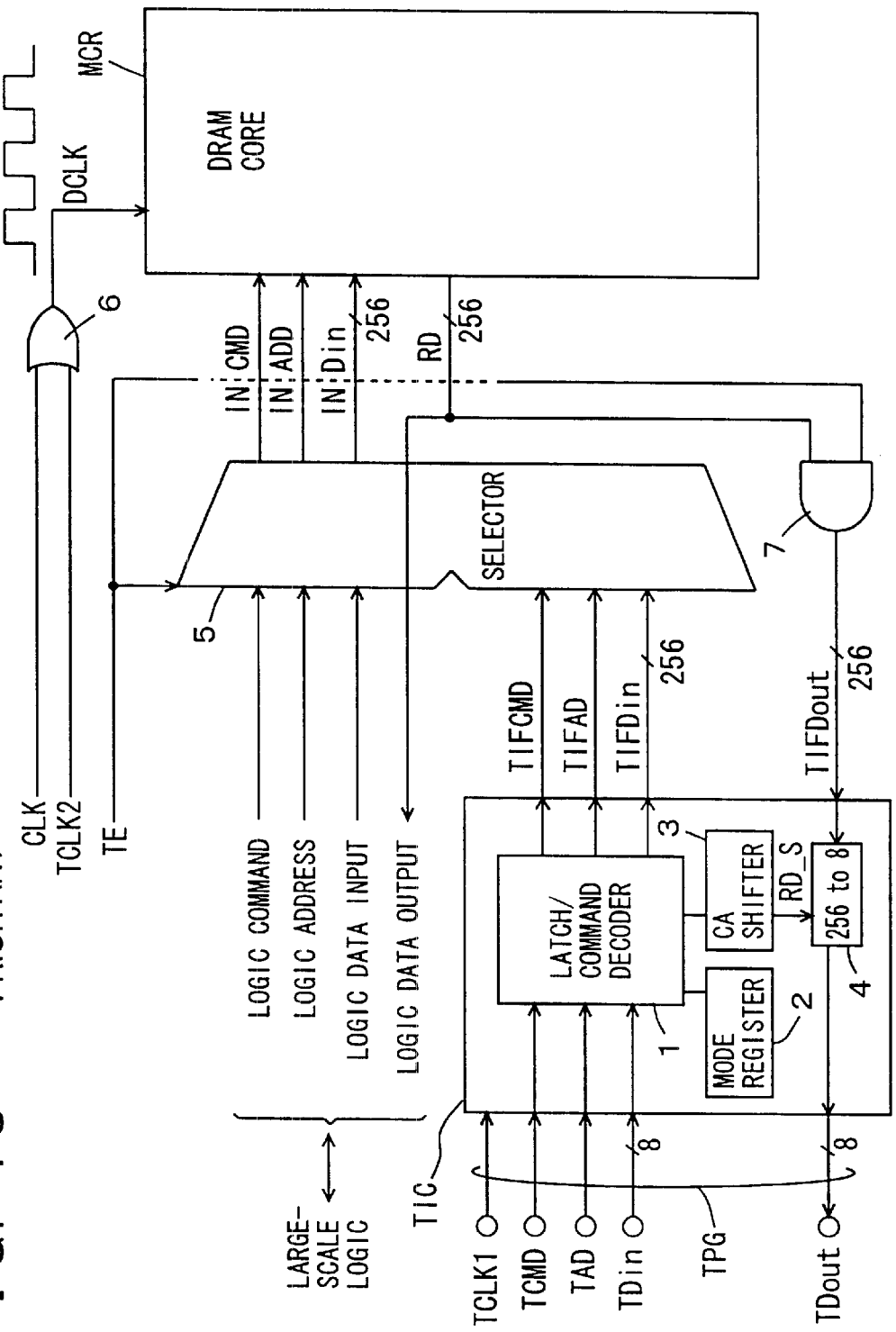
FIG. 18 is a schematic representation of the arrangement of a test interface circuit shown in FIG. 17.
Figure 19:
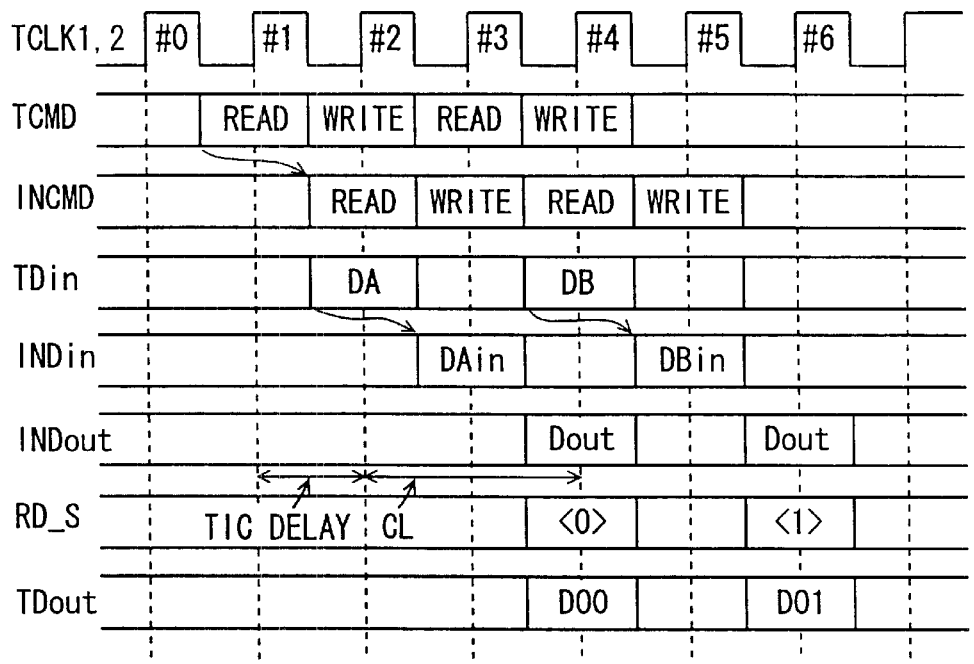
FIG. 19 is a timing chart representing an operation of the test interface circuit shown in FIG. 18.

DRAM core MCR, a selector 5, an AND circuit 7, and OR circuit 6 have the same arrangement as in the conventional arrangement shown in FIG. 18.

Figure 20:
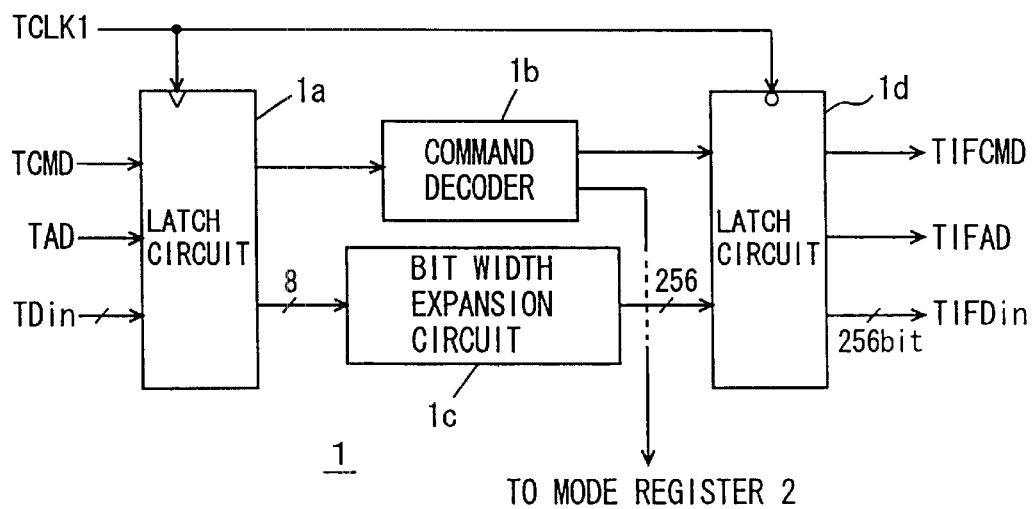
FIG. 20 is a schematic representation of the arrangement of a latch/command decoder shown in FIG. 18.
Figure 21:
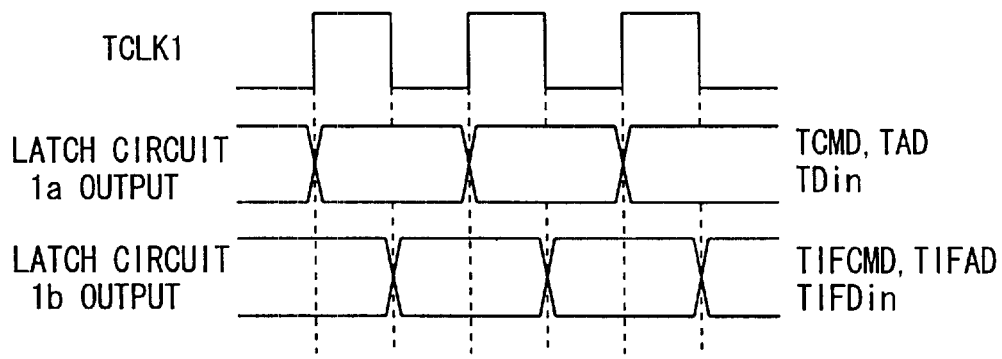
FIG. 21 is a timing chart representing an operation of the latch/command decoder shown in FIG. 20.
Figure 22:
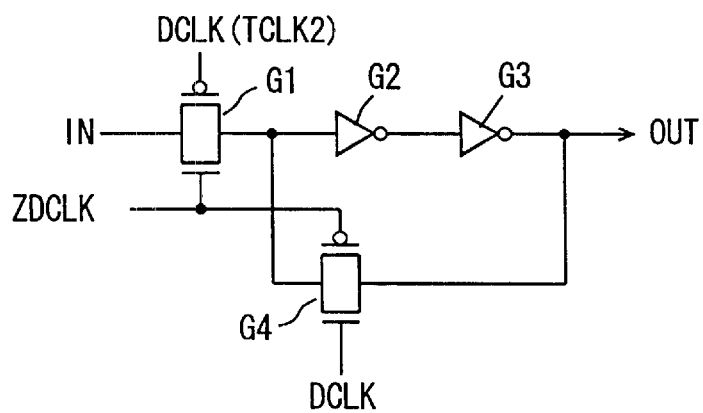
FIG. 22 is a diagram illustrating an example of the arrangement of a signal input circuit of a DRAM core.
Figure 23:
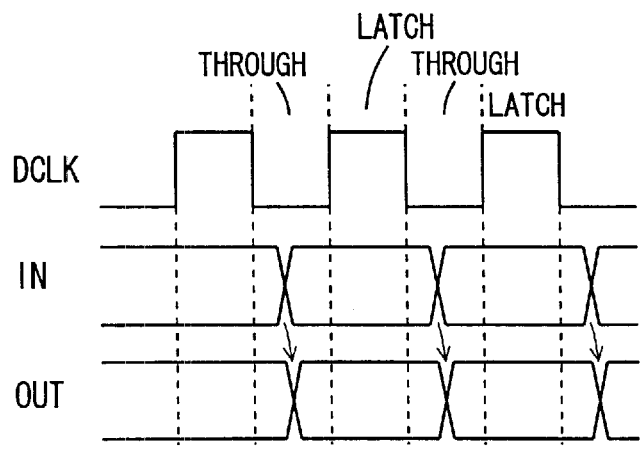
FIG. 23 is a timing chart representing an operation of the signal input circuit shown in FIG. 22.
Figure 27:
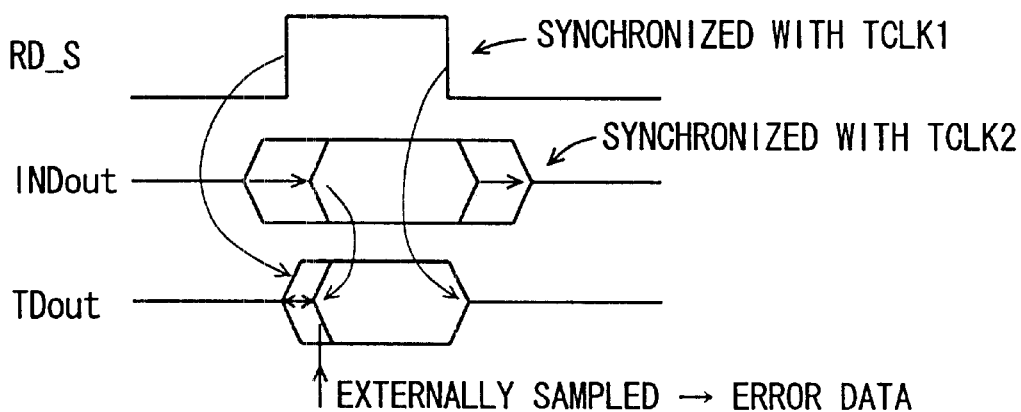
FIG. 27 is a diagram illustrating a problem of the test environment shown in FIG. 26.

FIG. 2 is a schematic representation of the arrangement of latch/command decoder 1 shown in FIG. 1. In latch/command decoder 1 shown in FIG. 2, an input stage latch circuit 1a operates in synchronization with basic test clock signal TST_CLKM, and an output stage latch circuit 1d operates in synchronization with first test clock signal TST_CLK1. The arrangement of other components is the same as that shown in FIG. 20, and the corresponding components are denoted by the same reference characters.

By applying basic test clock signal TST_CLKM to latch circuit 1a to perform the latching operation, latch circuit 1a can accurately take in a test control signal TCMD, a test address TAD, and test write data TDin from a tester. In this case, skews of test control signal TCMD, test address TAD, and test write data TDin relative to basic test clock signal TST_CLKM exist. Test control signal TCMD, test address TAD, and test write data TDin, however, are transferred in synchronization with basic test clock signal TST_CLKM. Consequently, if test control signal TCMD, test address TAD, and test write data CDin are output from the tester in synchronization with the fall of basic test clock signal TST_CLKM, for instance, the set-up period and the hold period in latch circuit 1a for each of test control signal TCMD, test address TAD, and test write data CDin can be set to a half the cycle period of basic test clock signal TST_CLKM (the duty ratio is set to 50%). As a result, latch circuit 1a can take in and latch test control signal TCMD, test address TAD, and test write data TDin and apply the latched signal/data to a command decoder 1b and a bit width expansion circuit 1c with accuracy and with enough time margin.

FIGS. 3A to 3E are diagrams illustrating an example of the phase relation between test clock signals TST_CLK1 and TST_CLK2 in the first embodiment of the present invention. The default value of the delay time for delay line 10 equals the fixed delay time of delay stage 12. Thus, when delay line 10 has the delay time of the default value, test clock signals TST_CLK1 and TST_CLK2 are of the same phase, and the set-up period and the hold period for each of a command TIFCMD, an address TIFAD, and write data TIFDin output from latch circuit 1d shown in FIG. 3B are equal to half the clock cycle of test clock signal TST_CLK1 (the duty ratio being 50%).

When the delay time of delay line 10 is made greater than the default value, the delay time of first test clock signal TST_CLK1 shown in FIG. 3A relative to basic test clock signal TST_CLKM becomes greater than that of second test clock signal TST_CLK2. Consequently, as shown in FIG. 3D, the phase of first test clock signal TST_CLK1 lags behind the phase of second test clock signal TST_CLK2. Since DRAM core MCR operates in synchronization with DRAM clock signal DCLK generated according to second test clock signal TST_CLK2, an increase in the delay time of delay 10 shortens the set-up period of a signal applied to DRAM core MCR.

On the other hand, when the delay time of delay line 10 is made shorter than the delay time of delay stage 12 by Tb, as shown in FIG. 3E, the phase of first test clock signal TST_CLK1 is advanced by time Tb relative to second test clock signal TST_CLK2. In this case, hold period tIH of an input signal for DRAM core MCR becomes shorter. Thus, by changing the delay time of delay line 10 relative to the delay time of delay stage 12, the set-up period and the hold period can be changed, and set-up time tIS and hold time tIH each can be measured by the period when an error occurs in the read data.

Figure 4:
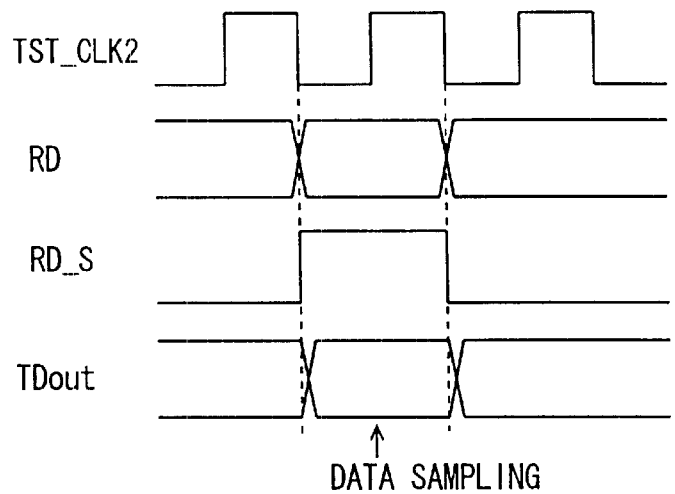
FIG. 4 is a timing chart representing an operation of a 256 to 8 selection circuit shown in FIG. 1.

Moreover, DRAM core MCR operates in synchronization with second test clock signal TST_CLK2 to generate read data RD. In test interface circuit TIC, CA shifter 3, performs the shifting operation in synchronization with second test clock signal TST_CLK2 like DRAM core MCR. Thus, as shown in FIG. 4, when read data RD is output in synchronization with the fall of test second clock signal TST_CLK2, for instance, read data selecting signal RD_S is activated in synchronization with the fall of second test clock signal TST_CLK2. Consequently, 256 to 8 selection circuit 4 performs the selecting operation according to second test clock signal TST_CLK2 and outputs read data TDout to the outside.

In the case in which an external tester performs data sampling according to basic test clock signal TST_CLKM, the delay time of delay stage 12 is fixed, and the delay time of second test clock signal TST_CLK2 relative to basic test clock signal TST_CLKM is known in advance. Thus, accurate data sampling can be performed by setting the sampling timing of test read data TDout in the tester according to a signal derived by delaying basic test clock signal TST_CLKM by the delay time of delay stage 12. Thus, by performing the shifting operation of CA shifter 3 in synchronization with second test clock signal TST_CLK2, the data read out from DRAM core MCR can be accurately. taken in and output to the outside in test interface circuit TIC even when the clock signal defining the timing at which test interface circuit TIC transfers a signal to DRAM core MCR and the clock signal defining the timing at which DRAM core MCR operates are different clock signals. Thus, when an error occurs, the selection circuit of test interface circuit TIC can be excluded from the factors causing inadequate set-up/hold time, so that the set-up time and the hold time can be accurately measured.

Figure 5A:
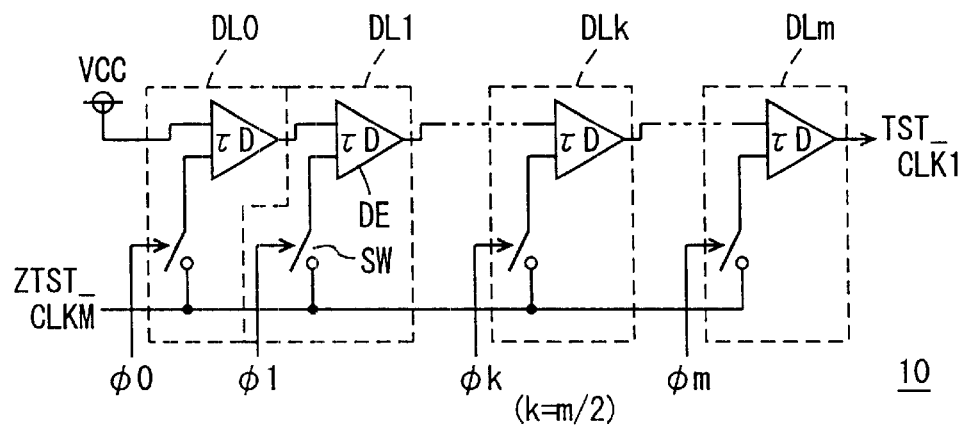
FIG. 5A is a schematic representation of the arrangement of a delay line shown in FIG. 1.

FIG. 5A is a diagram illustrating an example of the arrangement of delay line 10 shown in FIG. 1. In FIG. 5A, delay line 10 includes a plurality, (m+1), of cascaded unit delay elements DL0 to DLm. Unit delay elements DL0 to DLm each include a switching circuit SW for selecting a complementary basic test clock signal ZTST_CLKM in response to respective selecting signals φ0 to φm, and a delay circuit DE for transmitting the basic test clock signal received from associated switching circuit SW sequentially to the unit delay elements of the subsequent stages. Delay circuit DE has a unit delay time τD. In unit delay element DL0 of the initial stage, delay circuit DE receives a power-supply voltage VCC and a signal from switching circuit SW. First test clock signal TST_CLK1 is output from unit delay element DLm of the final stage.

Delay circuit DE in each of unit delay elements DL0 to DLm transmits complementary test clock signal ZTST_CLKM to a unit delay element of the subsequent stage when a test clock signal is applied from a corresponding switching circuit SW. When the corresponding switching circuit SW does not transmit the basic test clock signal, delay circuit DE transmits the signal applied from the unit delay element of the precedent stage to the subsequent stage. Thus, by rendering conductive one switching circuit SW in unit delay elements DL0 to DLm according to a signal set in mode register 2 or selecting signals φ0 to φm generated by decoding the data set in mode register 2, basic test clock signal TST_CLKM is transmitted to one unit delay element and is taken into the delay line, and is sequentially transmitted through the delay circuits of the subsequent stages.

Figure 5B:
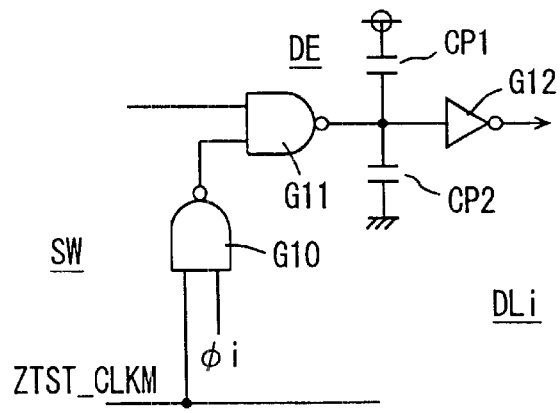
FIG. 5B is a diagram representing the arrangement of a unit delay element shown in FIG. 5A.

FIG. 5B is a diagram illustrating an example of the arrangement of unit delay elements DL0 to DLm shown in FIG. 5A. FIG. 5B shows the arrangement of one representative unit delay element DLi.

In FIG. 5B, unit delay element DLi includes an NAND circuit G10 receiving a selecting signal φi and basic test clock signal TST_CLKM, an NAND circuit G11 receiving an output signal from a delay circuit of the unit delay element of the preceding stage and an output signal from NAND circuit G10, an inverter circuit G12 receiving an output signal from NAND circuit G11, a capacitance element CP1 connected between an output node of NAND circuit G11 and a power-supply node, and a capacitance element CP2 connected between the output node of NAND circuit G11 and a ground node. Capacitance elements CP1 and CP2 connected to the output node of NAND circuit G11 provide delay to the output signal from NAND circuit G11, and a delay time τD of the necessary magnitude can be achieved by capacitance elements CP1 and CP2 with small occupying area. Both capacitance elements CP1 and CP2 are utilized so as to delay both the rise and the fall of the output signal from NAND circuit G11.

NAND circuit G10 corresponds to a switching circuit SW. NAND circuit G11, inverter circuit G12, and capacitance elements CP1 and CP2 correspond to a delay circuit DE.

In the arrangement of unit delay element DLi shown in FIG. 5B, when selecting signal φi is at the H level, NAND circuit G10 operates as an inverter buffer, buffers and inverts basic test clock signal TST_CLKM, and provides the inverted signal to NAND circuit G11. Only one of selecting signals φ0 to φm is set to the H level, and the remaining selecting signals are set to the L level. Thus, when selecting signal φi is at the H level, the remaining selecting signals φ0 to φ (i−1) and φ (i+1) to φm are all at the L level. Consequently, in each of these unit delay elements DL0 to DL (i−1) and DL (i+1) to DLm, the output signal from NAND circuit G10 attains the H level, and each delay circuit DE allows an output signal from the delay circuit of the precedent stage to pass through (NAND circuit G11 operates as an inverter circuit, and delay circuit DE becomes equivalent to the arrangement of two-stage cascaded inverter circuits). In unit delay circuit DL0 of the initial stage, a power-supply voltage VCC of the H level is applied to a first input of NAND circuit G11 so that the output signal from NAND circuit G11 attains the L level, while the output signal from inverter circuit G12 attains the H level. Therefore, when selecting signal φi is set at the H level and the remaining selecting signals φ0 to φ (i−1) and φ (i+1)−φm are all set to the L level, the output signal from NAND circuit G10 included in switching circuit SW attains the H level, NAND circuit G11 operates as an inverter circuit, and unit delay elements DL0 to DL (i−1) operate as buffer circuits, thereby an H level signal of power-supply voltage VCC level is transmitted.

In unit delay element DLi, therefore, complementary basic clock signal ZTST_CLKM is inverted by NAND circuit G10, and thereafter is buffered by NAND circuit G11 and inverter circuit G12, and is transmitted to the subsequent stage after a prescribed delay time. Each of unit delay elements DL (i+1) to DLm transmits an output signal from the unit delay element of the precedent stage after delay time τD allotted to each of unit delay elements DL (i+1) to DLm. Therefore, complementary basic test clock signal ZTST_CLKM is inverted and delayed by a prescribed time, and then is output from unit delay element DLm of the final stage as test clock signal TST_CLK1. This first test clock signal TST_CLK1 is thus a signal which is out of phase with respect to basic test clock signal TST_CLKM. Complementary basic test clock signal ZTST_CLKM is generated by inverting basic test clock signal TST_CLKM by an inverter. The delay time of this inverter is negligible.

When the delay time is at a default value, a selecting signal φk is held in the selected state. At this time, the sum τD·(m−k+1) of the delay times of unit delay elements DLk to DLm equals the delay time of delay stage 12.

Thus, by selectively driving one of selecting signals φ0 to φm to the active state, the delay time in delay line 10 can be changed from maximum value τmax to minimum value τmin. The set-up time/hold time is detected from the delay time of the delay line where an error occurs when the delay time is larger than the default value and also from the delay time of delay line 10 where an error occurs with the delay time being shorter than the default value (set to τo).

In other words, as shown in FIG. 6A, second test clocks signal TST_CLK2 has delay time τ0 relative to basic test clock signal TST_CLKM. The DRAM core latches (takes in) an applied signal in response to the rise of second test clock signal TST_CLK2. Now, as shown in FIG. 6B, consider the case in which first test clock signal TST_CLK1 is delayed by a delay time τ1 which is longer than delay time τ0 of the default value. In this case, the phase of first test clock signal TST_CLK1 lags behind the phase of second test clock signal TST_CLK2. A signal/data is applied to the DRAM core in synchronization with the fall of first test clock signal TST_CLK1. Therefore, if an error occurs for the first time in this state, a set-up time tIS of a signal to the DRAM core is inadequate so that the set-up time is derived from delay time τ1 and delay time τ0 of the default value. Since the delay time of first test clock signal TST_CLK1 relative to second test clock signal TST_CLK2 is (τ1−τ0), set-up time tIS is expressed by the following equation:

$$tIS=tCL-(\tau 1-\tau 0).$$

As shown in FIG. 6C, now consider the case in which the delay time of first test clock signal TST_CLK1 is made shorter and an error occurs for the first time at delay time τ2. When the delay time of first test clock signal TST_CLK1 is shortened, the phase of first test clock signal TST_CLK1 is advanced by time (τ0−τ2) relative to second test clock signal TST_CLK2. Since data/signal is applied to the DRAM core in synchronization with the rise of first test clock signal TST_CLK1, the hold period becomes shorter when the delay time is shortened as shown in FIG. 6C, and the phase of first test clock signal TST_CLK1 is advanced relative to second test clock signal TST_CLK2. Thus, hold time tIH is expressed by the following equation:

$$tIH=tCH-(\tau 0-\tau 2).$$

As a consequence, the time period of the search range for the set-up time and the hold time can be made substantially the same by setting default value τ0 in the middle of the delay time for delay line 10. Thus, the set-up period can be shortened to tCL−(τmax−τ0), and the hold period can be shortened to tCH−(τ0−τin).

With the arrangement shown in FIG. 5, default value τ0=τD·(m−k +1)), and the set-up time and the hold time can be tested with the precision of τmin=unit delay time τD of unit delay element DL.

In setting the data indicating the delay time into the mode register, an external test control signal TCMD to be decoded into a mode register set command MRS causes the mode register to store the necessary data applied through an appropriate terminal (for instance, an address signal input terminal and a write data input terminal) in the test signal terminal group.

According to the first embodiment of the present invention, based on the basic test clock signal from a tester, first and second test clock signals are derived using a delay line and a fixed delay stage so that the set-up time and the hold time for the DRAM core can be measured with accuracy. In addition, a shifter for generating a read data selecting signal for selecting read data from the DRAM core is supplied with the same test clock signal as the one to the DRAM core so that the deviation can be prevented between the timing at which read data becomes definite and the timing at which read data selecting signal from the DRAM core becomes definite. Thus, the set-up time and the hold time can be measured accurately.

Second Embodiment

Figure 7:
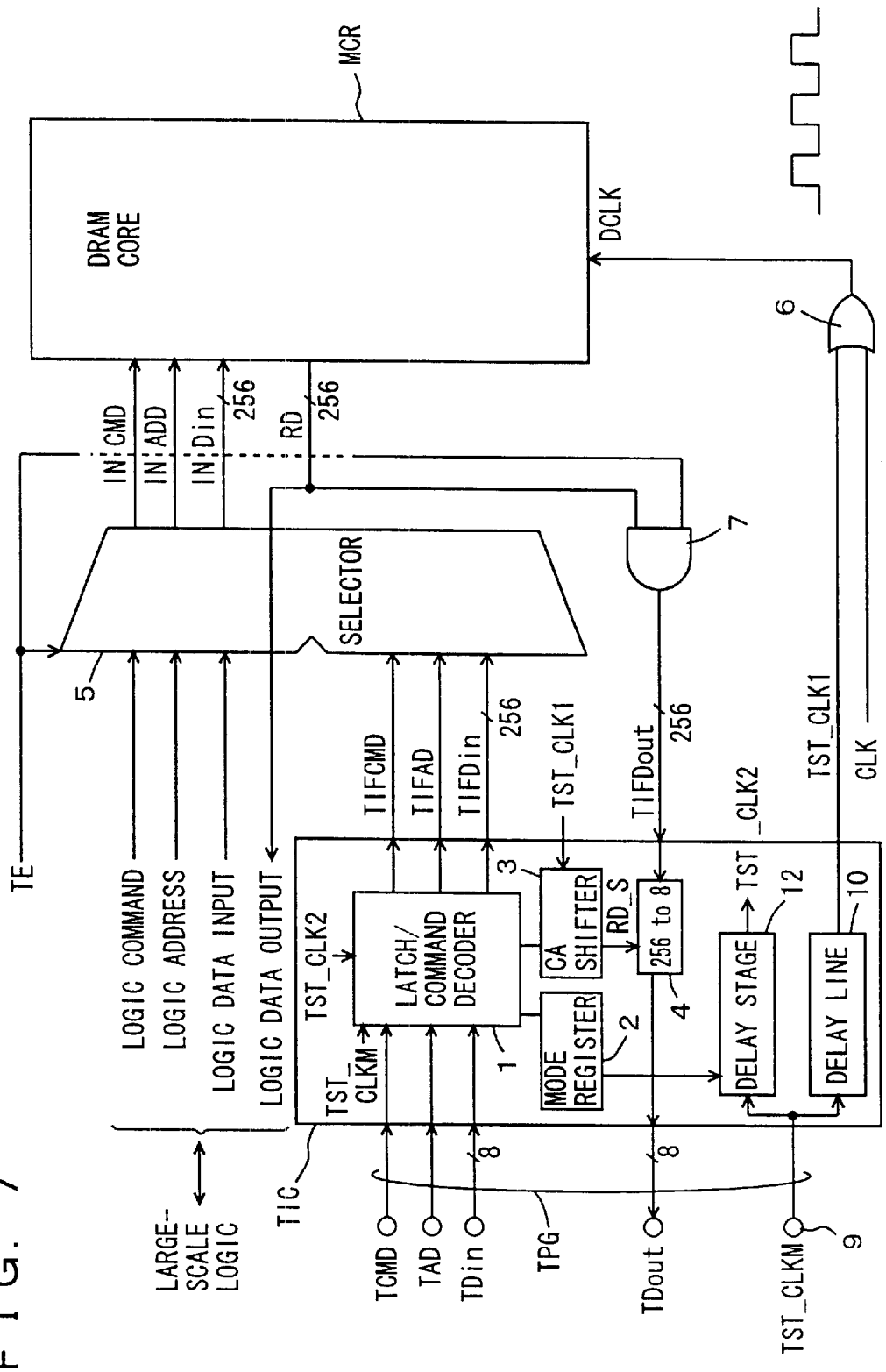
FIG. 7 is a schematic representation of the overall arrangement of a semiconductor integrated circuit device according to a second embodiment of the present invention.

FIG. 7 is a schematic representation of the arrangement of a main portion of a semiconductor integrated circuit device according to the second embodiment of the present invention. In a test interface circuit TIC in the arrangement shown in FIG. 7, a first test clock signal TST_CLK1 from a delay line 10 is applied to a DRAM core MCR via an OR circuit 6. Moreover, a CA shifter 3 for generating a read data selecting signal RD_S also receives first test clock signal TST_CLK1 from delay line 10. On the other hand, a second test clock signal TST_CLK2 from a delay stage 12 is applied to a latch/command decoder 1. The arrangement of other parts is the same as that of the first embodiment shown in FIG. 1 so that the corresponding components are denoted by the same reference characters, and the detailed descriptions thereof will not be repeated.

In the arrangement shown in FIG. 7, latch/command decoder 1 outputs signals TIFCMD, TIFAD and write data TIFDin according to second test clock signal TST_CLK2 having a fixed delay time relative to basic test clock signal TST_CLKM. DRAM core MCR takes in signals INCMD and INADD and external write data INDin applied via a selector 5 according to first test clock signal TST_CLK1, from delay line 10, having a delay time that can be changed in relation to basic test clock signal TST_CLKM, and generates read data RD. Thus, in this case also, the phase relation of test clock signals TST_CLK1 and TST_CLK2 can be changed so that the set-up time and the hold time of an input signal in the DRAM core can be measured accurately as in the first embodiment.

Figure 8:
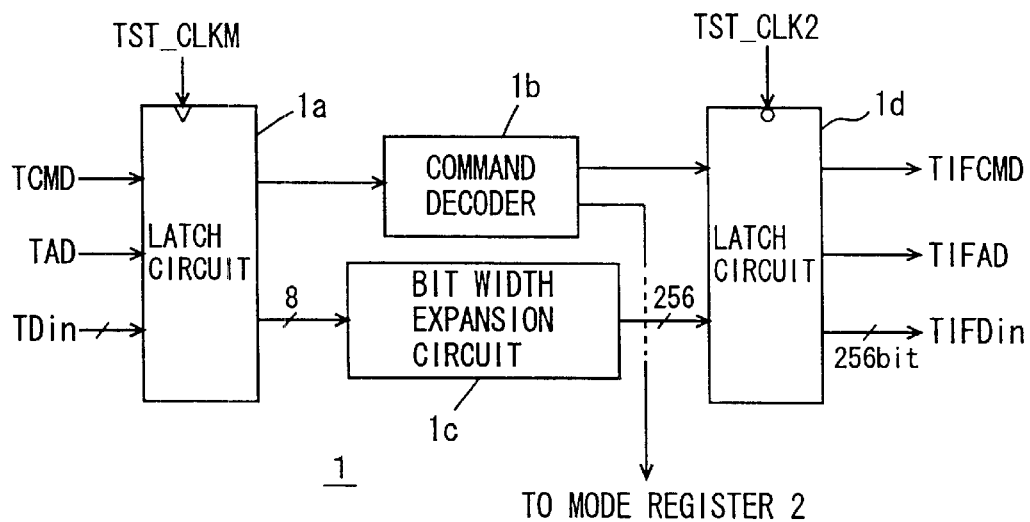
FIG. 8 is a schematic representation of the arrangement of a latch/command decoder shown in FIG. 7.

FIG. 8 is a schematic representation of the arrangement of latch/command decoder 1 shown in FIG. 7. In latch/command decoder 1 shown in FIG. 8, an input stage latch circuit 1a takes in a test control signal TCMD, a test address TAD, and test write data TDin from an outside according to basic test clock signal TST_CLKM as in the previous first embodiment. On the other hand, an output stage latch circuit 1d outputs an internal command signal TIFCMD, an internal address signal TIFAD, and internal test write data TIFDin for the DRAM core in synchronization with the fall of second test clock signal TST_CLK2. In other words, to DRAM core MCR, various signals/data are applied in synchronization with second test clock signal TST_CLK2.

Latch circuit 1d shown in FIG. 8 is a down-edge trigger type latch circuit utilizing a normal flip-flop that enters the latching state at the fall of test clock signal TST_CLK2. This down-edge trigger type latch circuit takes in and latches an applied signal in synchronization with the fall of a clock signal, and its output signal changes according to the signal taken in synchronization with the fall of the clock signal. A normal down-edge trigger type latch circuit can be used as latch circuit 1d, however, a circuit that enters the latching state in synchronization with the rise of test clock signal TST_CLK2 may be utilized as latch circuit 1d.

Figure 9:
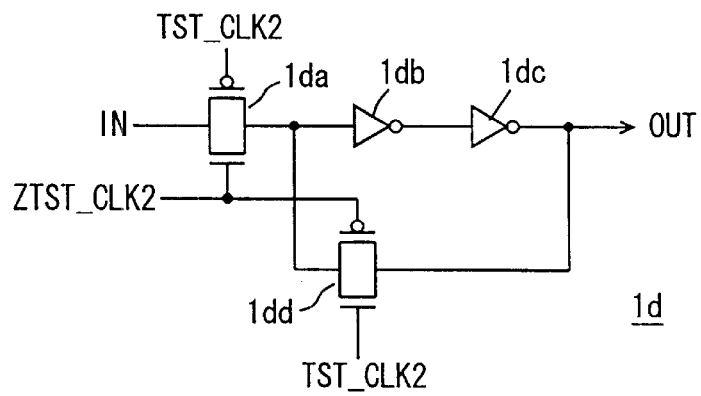
FIG. 9 is a diagram illustrating an example of the arrangement of an output stage latch circuit shown in FIG. 8.

FIG. 9 is a diagram illustrating a modification of output stage latch circuit 1d shown in FIG. 8. In FIG. 9, latch circuit 1d includes a CMOS transmission gate 1da rendered conductive when second test clock signal TST_CLK2 is at the L level for allowing a received signal IN to pass through, an inverter circuit 1da for inverting an output signal from CMOS transmission gate 1de, an inverter circuit 1dc for inverting an output signal from inverter circuit 1db to generate an output signal OUT, and a CMOS transmission gate 1dd rendered conductive when second test clock signal TST_CLK2 is at the H level for transmitting an output signal from inverter circuit 1dc to an input of inverter circuit 1db.

In the arrangement of latch circuit 1d shown in FIG. 9, CMOS transmission gate 1da is rendered conductive when second test clock signal TST_CLK2 is at the L level, and output signal OUT is generated according to input signal IN. When second test clock signal TST_CLK2 attains the H level, CMOS transmission gate 1da is rendered non-conductive, while CMOS transmission gate 1dd is rendered conductive. Consequently, inverter circuit 1db is isolated from input signal IN, and instead, receives output signal OUT. In other words, output signal OUT is held by inverter circuits 1db and 1dc and CMOS transmission gate 1dd. The input signal for latch circuit 1d is made definite when second test clock signal TST_CLK2 is at the H level.

Although latch circuit 1d shown in FIG. 9 enters the latching state in synchronization with the rise of test clock signal TST_CLK2, output signal OUT changes in synchronization with the fall of the test clock signal, thereby achieving the same function as the down-edge trigger type latch circuit shown in FIG. 8.

Input stage latch circuit 1a shown in FIG. 8 is an up-edge trigger type latch circuit that enters the latching state at the rise of test clock signal TST_CLKM, and its input signal is taken in and latched at the rise of test clock signal TST_CLKM, and its output signal changes according to a signal taken in in synchronization with the rise of test clock signal TST_CLKM. Thus, input stage latch circuit 1a can be also configured employing the following arrangement as a modification. A modified latch circuit 1a has the same arrangement as the modification of output stage latch circuit 1d shown in FIG. 9. The modified latch circuit 1a enters the through state when basic test clock signal TST_CLKM attains the H level, allowing/receiving signals TCMD and TAD and write data TDin to pass through, and enters the latching state when basic test clock signal TST_CLKM attains the H level.

Second test clock signal TST_CLK2 has a fixed delay time τ0 relative to basic test clock signal TST_CLKM. After command decoder 1b and bit width expansion circuit 1c perform processing of applied signals in synchronization with the rise of basic test clock signal TST_CLKM, latch circuit 1d allows these signals to pass through in synchronization with the fall of second test clock signal TST_CLK2 so that command decoder 1b and bit width expansion circuit 1c can drive the output signals to the definite state before latch circuit 1d enters the latching state. Thus, signals TIFCMD and TIFAD and test write data TIFDin can be transmitted from latch circuit 1d to the DRAM core in synchronization with the fall of second test clock signal TST_CLK2 with accuracy. Meanwhile, signals TCMD, TAD and write data TDin must be maintained in the definite state while test clock signal TST_CLKM is at the H level.

Figure 10:
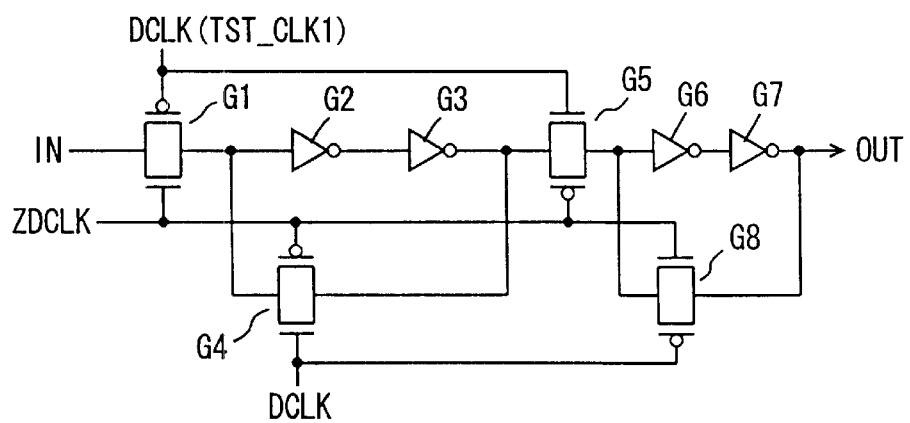
FIG. 10 is a diagram illustrating an example of the arrangement of a signal input circuit of a DRAM core shown in FIG. 7.

FIG. 10 is a diagram representing an example of the arrangement of an input circuit in the DRAM core. In FIG. 10, the input circuit of the DRAM core includes a CMOS transmission gate G1 rendered conductive, when a DRAM clock signal DCLK is at the L level, for allowing an input signal IN to pass through, two-stage cascaded inverter circuits G2 and G3 for buffering an output signal from CMOS transmission gate G1, and a CMOS transmission gate G4 rendered conductive, when DRAM clock signal DCLK is at the H level, for transmitting an output signal from inverter circuit G3 to an input of inverter circuit G2. These components form one-stage edge-trigger type D latch. When DRAM clock signal DCLK (second test clock signal TST_CLK2) attains the L level, input signal IN is taken in, and when DRAM clock signal DCLK attains the H level, the signal taken in is latched.

The input circuit further includes a CMOS transmission gate G5 rendered conductive when DRAM clock signal DCLK is at the H level, two-stage cascaded inverter circuits G6 and G7 for buffering a signal applied via CMOS transmission gate G5 to generate an internal signal OUT, and a CMOS transmission gate G8 rendered conductive, when DRAM clock signal DCLK is at the L level, for transmitting signal OUT from inverter circuit G7 to an input of inverter circuit G6. When the edge-trigger type D latch of the initial stage enters the latching state, CMOS transmission gate G5 is rendered conductive in synchronization with DRAM clock signal DCLK, and internal signal OUT is generated according to an output signal from inverter circuit G3.

When DRAM clock signal DCLK falls to the L level and CMOS transmission gate G1 is rendered conductive, CMOS transmission gate G5 is rendered non-consuctive and CMOS transmission gate G8 is rendered conductive so that the stage edge-trigger type D latch of the second stage enters the latching state. By changing the phase of first test clock signal TST_CLK1, the set-up/hold period for input signal IN can be changed, which allows the measurement of set-up time tIS and hold time tIH.

FIGS. 11A to 11E are diagrams illustrating the timing relation between first and second test clock signals TST_CLK1 and TST_CLK2 in the second embodiment of the present invention. As shown in FIG. 11B, latch circuit 1d changes its output signal in synchronization with the fall of second test clock signal TST_CLK2 shown in FIG. 11A. As shown in FIG. 11C, when delay line 10 has the delay time of the default value, first test clock signal TST_CLK1 and second test clock signal TST_CLK2 have the same phase.

On the other hand, when the delay time for delay line 10 is made smaller than the default value, the phase of first test clock signal TST_CLK1 is advanced relative to second test clock signal TST_CLK2 so that the set-up period becomes shorter, as shown in FIG. 11D.

When the delay time for delay line 10 is made longer than the default value, the phase of first test clock signal TST_CLK1 lags behind second test clock signal TST_CLK2, as shown in FIG. 11E. In this state, the hold period becomes shorter. Thus, as in the first embodiment, by changing the delay time of delay line 10 from the minimum value τmin up to the maximum value τmax, set-up time tIS and hold time tIH can be measured based on the delay time at the time at which an error occurs. Maximum value τmax of delay time τ is smaller than half the cycle period of a test clock signal so that the number of delay stages can be reduced.

FIGS. 12A to 12C are diagrams illustrating the relations between the delay time for delay line 10 and set-up time tIS and hold time tIH. As shown in FIG. 12A, second test clock signal TST_CLK2 has delay time τ0 relative to basic test clock signal TST_CLKM. Now, consider the case in which an error occurs for the first time when the delay time for delay line 10 is made greater than delay time τ0 of the default value, i.e. up to time τ3. In this case, first test clock signal TST_CLK1 lags in phase behind second test clock signal TST_CLK2, as shown in FIG. 12B. The DRAM core takes in a signal in synchronization with the rise of first test clock signal TST_CLK1. Thus, the hold period becomes shorter in this state. The phase difference between first and second test clock signals TST_CLK1 and TST_CLK2 is τ3−τ0 (τ3>τ0). Thus, hold time tIH can be derived from the following equation:

$$tIH=tCH-(\tau 3-\tau 0).$$

Now, consider the case in which the delay time of delay line 10 is made shorter than default value τ0 and an error occurs for the first time at delay time τ4. In this case, as shown in FIG. 12C, the phase of first test clock signal TST_CLK1 is advanced relative to second test clock signal TST_CLK2, and the phase difference thereof is given by (τ0−4). In this state, the set-up period becomes short so that set-up time tIS is derived from the following equation:

$$tIS=tCL-(\tau 0-\tau 4).$$

Thus, the set-up time and the hold time can be measured in the similar manner in the second embodiment. In test interface circuit TIC, the CA shifter performs the shifting operation according to first test clock signal TST_CLK1, and the timing at which read data selecting signal RD_S becomes definite is the same as the timing at which read data RD read out from DRAM core MCR becomes definite. Thus, selection circuit 4 for selecting 8 bits out of 256 bits does not adversely affect the set-up time/hold time measurement.

As described above, according to the second embodiment of the present invention, as in the first embodiment, two-phase test clock signals are generated from a common test clock signal using a delay line to change the hold period and the set-up period for an input signal so that the set-up time and the hold time can be measured accurately simply by one test clock signal from a tester.

Third Embodiment

FIG. 13 is a schematic representation of the arrangement of a main portion of a test interface circuit TIC according to the third embodiment of the present invention. In FIG. 13, an inverter circuit 20 for inverting a basic test clock signal TST_CLKM to generate a first test clock signal TST_CLK1 from basic test clock signal TST_CLKM, a multiplexer (MUX) 21 for selecting one of basic test clock signal TST_CLKM and an output signal from inverter circuit 20 according to a mode designating signal φmd, and a variable delay circuit 22 for delaying an output signal from multiplexer 21 for the delay time set by a selecting signal φ are provided. Variable delay circuit 22 has a delay time that varies from 0 to a maximum value τmax.

Second test clock signal TST_CLK2 is generated from basic test clock signal TST_CLKM. Second test clock signal TST_CLK2 may be generated from a buffer circuit that receives basic test clock signal TST_CLKM. In this case, the propagation delay in multiplexer 21 and inverter circuit 20 can be compensated for by the buffer circuit. The arrangement of other portions is the same as that in the first or the second embodiment. Now, the operation of a test clock signal generating portion shown in FIG. 13 will be described with reference to the timing chart shown in FIGS. 14A to 14E.

As shown in FIG. 14A, basic test clock signal TST_CLKM has an L level period tCL and an H level period tCH. Inverter 20 inverts basic test clock signal TST_CLKM as shown in FIG. 14B. Therefore, in this case, inverter circuit 20 generates a clock signal that is 180° out of phase to basic test clock signal TST_CLKM. The output signal from inverter circuit 20, in effect, is considered to be the clock signal whose phase is advanced relative to basic test clock signal TST_CLKM.

Variable delay circuit 22 delays a signal applied from multiplexer 21 by the delay time set by selecting signal φ. By selecting basic test clock signal TST_CLKM by multiplexer 21 according to mode selecting signal φmd and by setting the delay time of variable delay circuit 22 to 0 as a default value, the phases of first and second test clock signals TST_CLK1 and TST_CLK2 can be matched. When multiplexer 21 selects basic test clock signal TST_CLKM according to mode designating signal φmd and variable delay circuit 22 delays basic test clock signal TST_CLKM from multiplexer 21, first test clock signal TST_CLK1 is delayed by delay time τ of variable delay circuit 22 relative to basic test clock signal TST_CLKM as shown in FIG. 14C, and therefore to the phase of second test clock signal TST_CLK2. In other words, the delay time of variable delay circuit 22 provides the delay time of first test clock signal TST_CLK1 relative to second test clock signal TST_CLK2 shown in FIG. 14E.

On the other hand, when multiplexer 21 selects an output signal from inverter circuit 20 according to mode selecting signal φmd, the phase difference between first test clock signal TST_CLK1 and second test clock signal TST_CLK2 becomes time tCL−τ or tCH−τ. Thus, in this case, as shown in FIG. 14D, the phase of first test clock signal TST_CLK1 is advanced by time tCL−τ or tCH−τ relative to second test clock signal TST_CLK2 shown in FIG. 14E.

One of these first and second test clock signals TST_CLK1 and TST_CLK2 is applied to the DRAM core and the CA shifter, while the other test clock signal is applied to the latch/command decoder. As a result, the set-up period and the hold period can be changed using variable delay circuit 22, and set-up time tIS and hold time tIH can be measured.

The correspondence between mode selecting signal φmd and the set-up time and hold time measurement changes depending on which of the first and second embodiments is employed for the measurement of the set-up time and the hold time. By setting the duty of basic test clock signal TST_CLKM to 50%, the phase relation between the first and second test clock signals TST_CLK1 and TST_CLK2 can be changed using the output signal from inverter circuit 20 and basic test clock signal TST_CLKM.

For instance, in the case in which second test clock signal TST_CLK2 is applied to the DRAM core and first test clock signal TST_CLK1 is applied to the latch/command decoder, multiplexer 21 is made to select basic test clock signal TST_CLKM when measuring the set-up time. In this case, as delay time τ of variable delay circuit 22 increases from minimum value τmin to maximum value τmax, the set-up period becomes shorter. If the delay time of variable delay circuit 22 at the time when an error occurs for the first time is τa, set-up time tIS is given by time tCL−τa.

In the measurement of the hold time, multiplexer 21 is made to select the output signal from inverter circuit 20, and the delay time of variable delay circuit 22 is sequentially changed from maximum value τmax to minimum value τmin. As delay time τ of variable delay circuit 22 becomes smaller, the phase difference between first test clock signal TST_CLK1 and second test clock signal TST_CLK2 becomes greater so that the hold period becomes shorter sequentially. Thus, if the delay time of variable delay circuit 22 at the time when error occurs for the first time is τb, hold time tIH is given by τb.

Moreover, in the case in which first test clock signal TST_CLK1 is applied to the DRAM core and second test clock signal TST_CLK2 is provided to the latch/command decoder, the set-up time and the hold time can be measured in the similar manner by sequentially shortening the set-up period and the hold period.

Figure 15A:
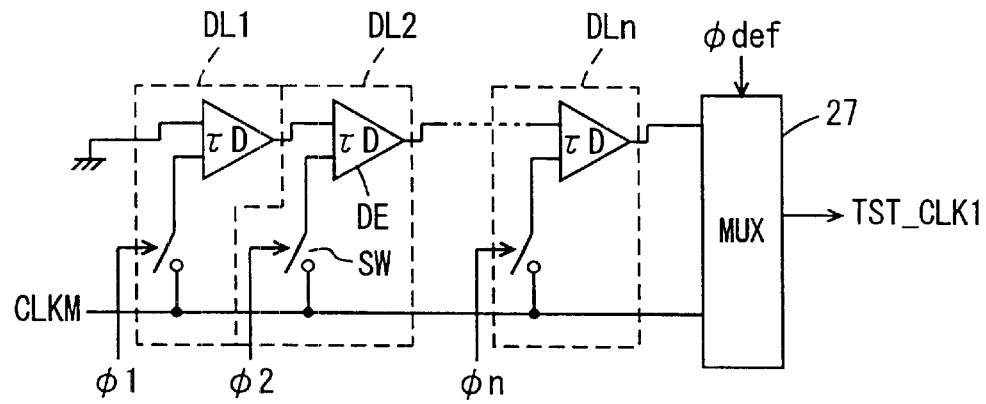
FIG. 15A is a diagram representing the arrangement of a variable delay circuit shown in FIG. 13.

FIG. 15A is a schematic representation of the arrangement of variable delay circuit 22 shown in FIG. 13. In FIG. 15A, variable delay circuit 22 includes a plurality (n stages) of cascaded unit delay elements DL1 to DLn, and a multiplexer 27 for selecting one of an output signal from unit delay element DLn of the final stage and a clock signal CLKM from multiplexer 21 shown in FIG. 13. Multiplexer 27 selects one of the output signal from unit delay element DLn and clock signal CLKM according to a selecting signal φdef and generates first test clock signal TST_CLK1.

Each of unit delay elements DL1 to DLn includes a delay circuit DE having a unit delay time τD, and a switching circuit SW for introducing clock signal CLKM to the delay line. Delay circuit DE of unit delay element DL1 of the initial stage receives a ground voltage at one input.

Figure 15B:
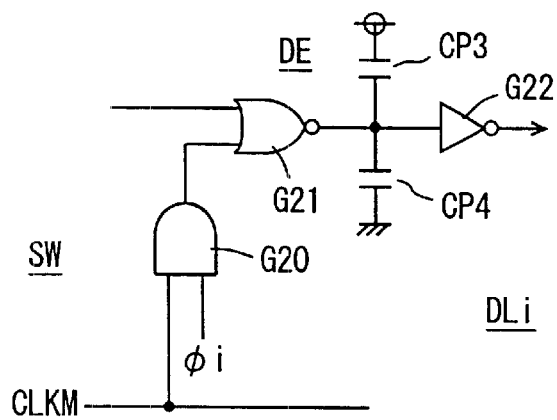
FIG. 15B is a diagram illustrating an example of the arrangement of a unit delay element shown in FIG. 15A.

FIG. 15B is a schematic representation of the arrangement of unit delay elements DL1 to DLn shown in FIG. 15A. In FIG. 15B, unit delay element DLi (i=1 to n) includes an AND circuit G20 for receiving clock signal CLKM and a selecting signal φi; an NOR circuit G21 for receiving an output signal from a unit delay element of the precedent stage and an output signal from AND circuit G20; capacitance elements CP3 an CP4 for delaying the rise and the fall of an output signal from NOR circuit G21; and an inverter circuit G22 for inverting the output signal from NOR circuit G21 and transmitting the inverted signal to the unit delay elements of the subsequent stage or to multiplexer 27.

When one of selecting signals φ1 to φn is set to the H level, the delay time is set at the step of unit delay time τD. In the default state, the delay time of variable delay circuit 22 is 0 so that multiplexer 27 selects clock signal CLKM according to selecting signal φdef.

When selecting signal φi is at the L level in FIG. 15B, the output signal from AND circuit G20 attains the L level. In unit delay element DL1 of the initial stage, NOR circuit G21 receives the ground voltage, and when unit delay element DL1 is in the non-selected state, the output signal from NOR circuit G21 attains the H level, and an L level signal is output from inverter circuit G22, responsively. Thus, when selecting signal φi is at the H level, unit delay elements DL1 to DL (i−1) corresponding to selecting signals φ1 to φ (i−1) all output L level signals. When selecting signal φi attains the H level in unit delay element DLi, AND circuit G20 allows clock signal CLKM to pass through. NOR circuit G21 receives the L level signal from unit delay element DL (i−1) of the precedent stage so that NOR circuit G21 operates as an inverter. Thus, through NOR circuits G21 and inverter G22, clock signal CLKM being delayed by unit delay time τD is applied to a unit delay element of the subsequent stage. In each of unit delay elements DL (i+1) to DLn of the subsequent stages, an output signal from AND circuit G20 is at the L level and NOR circuit G21 operates as an inverter circuit. Unit delay elements of the DL (i+1) to DL n of the subsequent stages each delay the clock signal output from unit delay element DLi by unit delay time cD and output the delayed signal. Therefore, when selecting signal φi is set to the selected state, delay time τ in variable delay circuit 22 is given by (n−i+1) τD.

Selecting signals φ1 to φn and φdef are generated according to the data set in a mode register. The arrangement of the delay line previously shown in FIGS. 5A and 5B can be utilized for the delay stage of variable delay circuit 22.

Circuits that is capable of performing the selecting operation according to mode designating signal φmd and default selecting signal φdef, respectively, can be used for multiplexers 21 and 27, and they are formed by CMOS transmission gates, for instance. Moreover, multiplexers 21 and 27 can each be formed by a tristate inverter buffer. In this case, the gate delay of the multiplexer is provided by the tristate inverter buffer so that, by providing, for second test clock signal TST_CLK2 as a buffer circuit, two stages of inverter circuits having the same delay time, the phases of first and second test clock signals TST_CLK1 and TST_CLK2 can be accurately matched in the default state.

Figure 16:
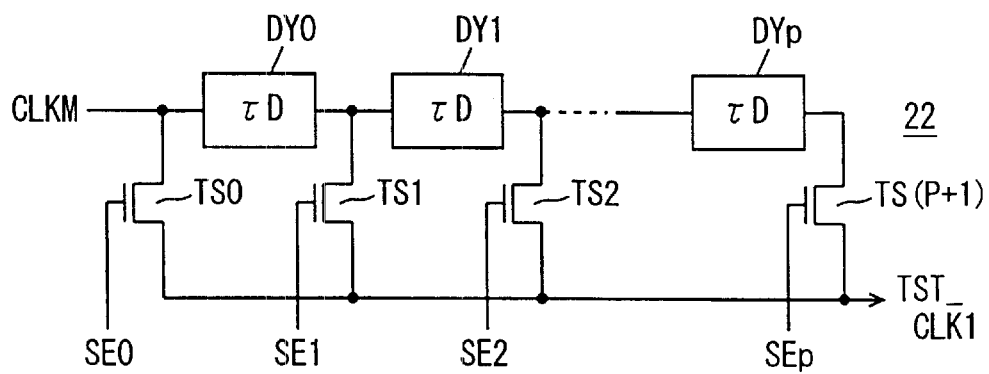
FIG. 16 is a diagram illustrating a modification of the arrangement of a variable delay circuit shown in FIG. 13.
Figure 17:
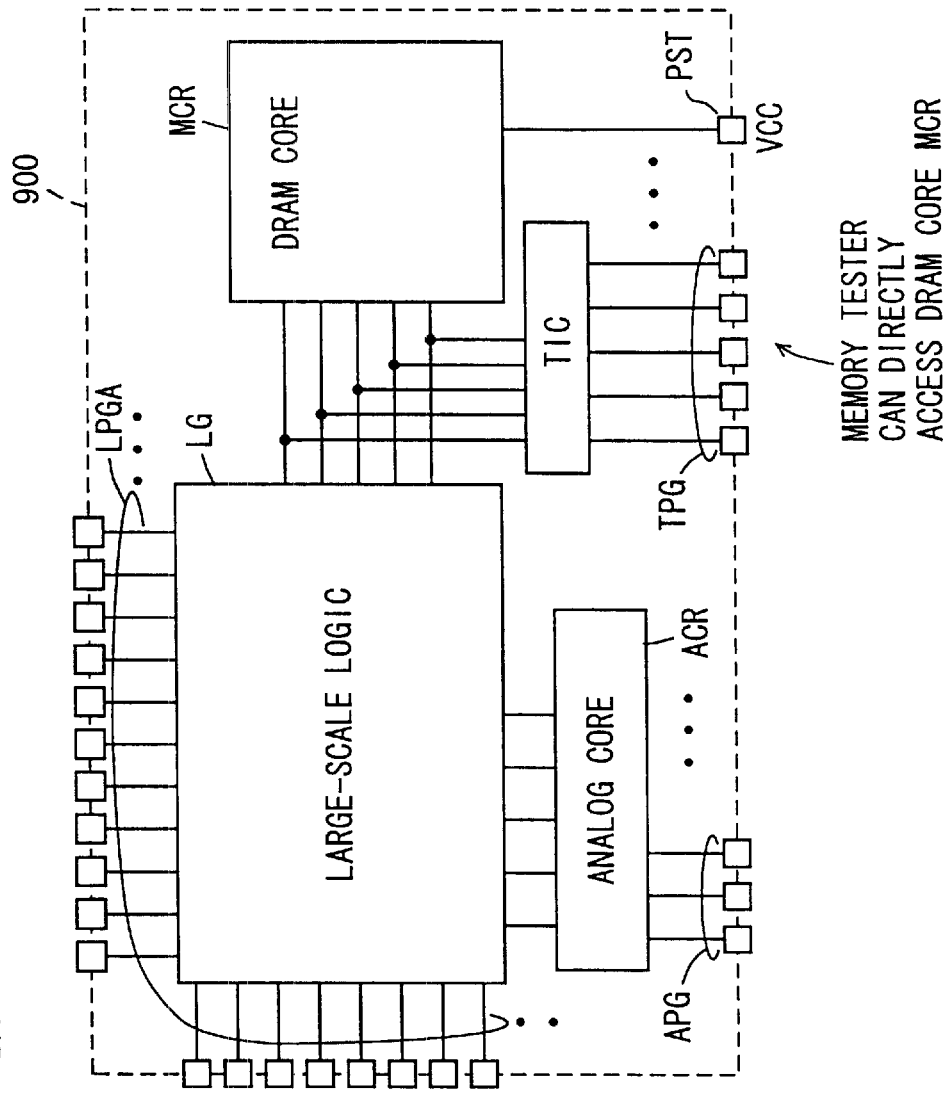
FIG. 17 is a schematic representation of the overall arrangement of a conventional DRAM-embedded system LSI.

FIG. 16 is a diagram illustrating a modification of variable delay circuit 22 shown in FIG. 13. In FIG. 16, variable delay circuit 22 includes a plurality of cascaded unit delay elements DY0 to DYp, select gates TS1 to TS (p+1) provided corresponding to outputs of unit delay elements DY0 to DYp and rendered conductive in response to selecting signals SE1 to SEp for selecting output signals of the corresponding unit delay elements, and a select gate TS0 for selecting clock signal CLKM according to selecting signal SE0. The respective output nodes of select gates TS0 to TS (p+1) are coupled in common to a clock signal line that outputs first test clock signal TST_CLK1. Selecting signals SE0 to SEp are generated according to the delay time data stored in the mode register (for instance, via a decoder or by the data itself. One of selecting signals SE0 to SEp is driven to the active state, and a corresponding select gate is rendered conductive.

With the arrangement of variable delay circuit 22 shown in FIG. 16, the unit time can be changed within the range of 0 to τD·(p+1) by a step of unit delay time τD. Each of unit delay elements DY0 to DYp is formed, for instance, by cascaded delay inverter buffers of even-number stages (two stages) and a delaying capacitance element. In the arrangement of the variable delay circuit shown in FIG. 16, unit delay elements DY0 to DYp perform the charging/discharging operation according to clock signal CLKM in a test operation. The gate scale, however, can be reduced.

Moreover, select gates TS0 to TS (p+1) may be formed by CMOS transmission gates or by tristate inverter buffers.

As seen from the above, according to the third embodiment of the present invention, a delay line is formed using a basic test clock signal and its inverted signal so that the delay time required for the delay line is only half the cycle period of the test clock signal. As a result, the number of stages of delay elements can be reduced, resulting in reduced circuit scale.

Other Applications

The embedded memory of the present invention is not limited to a DRAM but may be other memories such as a burst SRAM (Static Random Access Memory) that operates in synchronization with a clock signal or a flash memory. The present invention is applicable to a circuit for testing a clock synchronous memory integrated together with a logic on the same semiconductor substrate.

In addition, in the above-described embodiments, a circuit for selecting read data performs the selecting operation according to a read data selecting signal RD_S. Even when latch circuits are provided to an input stage and to an output stage of the circuit for selecting the read data, respectively, the latch circuit for taking in data RD read out from a memory circuit is operated by the same test clock signal as a DRAM core so that the data read out from the DRAM core can be taken in regardless of the phase difference between first and second test clock signals, and the set-up time and the hold time can be measured accurately.

Moreover, in the above-described embodiments, the DRAM core operates in synchronization with one edge of a test clock signal. The present invention, however, is applicable to an SDRAM of a DDR (Double Data Rate) mode that writes and reads data in synchronization with both the rising edge and the falling edge of the test clock signal.

Furthermore, read data selecting signal RD_S is generated by decoding the upper 5 bits of a column address signal. Data read selecting signal RD_S may be generated by a CA shifter shifting the 5 bits and decoding the 5 bits in the output portion of the CA shifter. Any arrangement can be applied for the CA shifter as long as a shift circuit performs the shifting operation for column latency in synchronization with a an applied clock signal.

As discussed above, according to the present invention, two test clock signals are generated from one test clock signal, and the set-up time and the hold time of an input signal of an embedded memory can be measured with accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a clock circuit for generating a first clock signal and a second clock signal according to a basic clock signal;

a memory circuit for storing data and operating in synchronization with one of said first clock signal and said second clock signal and according to a received operation designation; and a control transfer circuit for applying said operation designation to said memory circuit in response to other of said first clock signal and said second clock signal.

2. The semiconductor integrated circuit device according to claim 1, wherein said clock circuit includes a delay line having a variable delay time, for receiving said basic clock signal to generate said first clock signal, and a delay stage having a fixed delay time, for receiving said basic clock signal to generate said second clock signal.

3. The semiconductor integrated circuit device according to claim 2, wherein a delay time initially set in said delay line is substantially equal to the fixed delay time of said delay stage.

4. The semiconductor integrated circuit device according to claim 2, further comprising a mode register for storing data for designating the delay time of said delay line, wherein said delay line includes cascaded delay elements for transmitting said basic clock signal and a circuit for setting number of cascaded stages of said cascaded delay elements according to the data stored in said mode register.

5. The semiconductor integrated circuit device according to claim 1, wherein said clock circuit includes a delay circuit having a variable delay time, and a selector for selecting one of said basic clock signal and an inverted signal of said basic clock signal in response to a selecting signal for application to said delay circuit.

6. The semiconductor integrated circuit device according to claim 2, wherein said one is said first clock signal and said other is said second clock signal.

7. The semiconductor integrated circuit device according to claim 2, wherein said one is said second clock signal, and said other is said first clock signal.

8. The semiconductor integrated circuit device according to claim 5, wherein said delay circuit produces said first clock signal, and said basic clock signal is supplied as said second clock signal.

9. The semiconductor integrated circuit device according to claim 5, wherein said delay circuit has a delay time set by delay data stored in a mode register responsive to a mode register set command for storing said delay data.

10. The semiconductor integrated circuit device according to claim 1, wherein said clock circuit includes a circuit for making phases of the first and second clock signals different from each other.

11. The semiconductor integrated circuit device according to claim 1, wherein the first and second clock signals are different in phase from each other, and are the same in frequency as said basic clock signal.

12. The semiconductor integrated circuit device according to claim 1, further comprising a read transfer circuit for transferring data read out from said memory circuit in response to said one of the first and second clock signals.

13. The semiconductor integrated circuit device according to claim 1, further comprising a selector responsive to an operation mode instructing signal for coupling said control transfer circuit to said memory circuit.

* * * * *